(12) United States Patent
Kim et al.

(10) Patent No.: US 10,804,336 B2
(45) Date of Patent: Oct. 13, 2020

(54) DISPLAY DEVICE

(71) Applicant: Samsung Display Co. Ltd., Yongin-si (KR)

(72) Inventors: Yeon Tae Kim, Yongin-si (KR); Chung Yi, Seongnam-si (KR); Young Kwan Kim, Seoul (KR); Young Soo No, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/299,140

(22) Filed: Mar. 12, 2019

(65) Prior Publication Data

US 2020/0035762 A1    Jan. 30, 2020

(30) Foreign Application Priority Data

Jul. 25, 2018  (KR) .................. 10-2018-0086741

(51) Int. Cl.
*H01L 23/544* (2006.01)
*H01L 27/32* (2006.01)

(52) U.S. Cl.
CPC ........ *H01L 27/3223* (2013.01); *H01L 27/323* (2013.01); *H01L 27/3258* (2013.01); *H01L 27/3262* (2013.01); *H01L 27/3276* (2013.01)

(58) Field of Classification Search
CPC ............... H01L 27/3223; H01L 27/323; H01L 27/3258; H01L 27/3262; H01L 27/3276;
(Continued)

(56) References Cited

U.S. PATENT DOCUMENTS 7,816,223 B2    10/2010  Chang et al.
2006/0146263 A1*  7/2006  Park ..................... H05K 3/0052
                                                            349/149
(Continued)

FOREIGN PATENT DOCUMENTS

KR    10-2001-0005118    1/2001
KR    10-2013-0066917    6/2013
(Continued)

OTHER PUBLICATIONS

Extended European Search Report dated Jun. 24, 2019, issued in European Patent Application No. 19157379.9.

*Primary Examiner* — Steven H Loke
*Assistant Examiner* — Samuel Park
(74) *Attorney, Agent, or Firm* — H.C. Park & Associates, PLC

(57) ABSTRACT

A display device includes a display unit including transistors disposed in a display area and signal lines arranged in a non-display area located along an edge of the display area, at least one of the signal lines being electrically connected to the transistors; and an input sensing unit disposed over the display unit and including sensing electrodes disposed on the display area, sensing lines arranged on the non-display area, and a first dummy pattern disposed on the non-display area and spaced apart from the sensing electrodes as compared with the sensing line, wherein the first dummy pattern overlaps a first signal line of the signal lines, the first signal line being spaced farthest from the display area, a planar shape of an overlap pattern formed by overlapping the first dummy pattern and the first signal line coincides with a planar shape of an alignment mark.

14 Claims, 30 Drawing Sheets

(58) Field of Classification Search
CPC ......... H01L 2223/54486; H01L 27/124; H01L 23/544; H01L 2223/54426; H05K 2201/09918; H05K 1/0269; G02F 2001/133325; G02F 1/136286; G02F 1/13338; G02F 1/133514; G02F 2001/133322; G02F 2001/133331; G02F 1/1303

See application file for complete search history.

(56) References Cited

U.S. PATENT DOCUMENTS

| | | | |
|---|---|---|---|
| 2006/0290841 | A1 | 12/2006 | Kwon et al. |
| 2009/0045727 | A1* | 2/2009 | Kwak ............... H05B 45/60 313/504 |
| 2015/0108611 | A1* | 4/2015 | Kumagai ............ H01L 23/5226 257/620 |
| 2016/0093684 | A1 | 3/2016 | Youk et al. |
| 2017/0090228 | A1* | 3/2017 | Ishikawa ............. H01L 27/1218 |
| 2019/0229066 | A1* | 7/2019 | Chang ................ H01L 27/1218 |

FOREIGN PATENT DOCUMENTS

| | | |
|---|---|---|
| KR | 10-1321298 | 10/2013 |
| KR | 10-1332775 | 10/2013 |
| KR | 10-2015-0138903 | 12/2015 |

\* cited by examiner

DISPLAY DEVICE

CROSS REFERENCE TO RELATED APPLICATION

This application claims priority from and the benefit of Korean Patent Application No. 10-2018-0086741, filed on Jul. 25, 2018, which is hereby incorporated by reference for all purposes as if fully set forth herein.

BACKGROUND

Field

Exemplary embodiments of the invention relate generally to a display device.

Discussion of the Background

A display device includes a display panel for displaying an image and a window disposed over the display panel to protect the display panel.

In order to recognize the position of the display panel in the process of attaching the window to the display panel, the display panel includes an alignment mark for position recognition.

The alignment mark is provided to the non-display area (that is, an area where an image is not displayed) of the display panel. In this case, due to the design constraints of the alignment mark, a dead space may occur in the non-display area.

Recently, it has been increasingly required to reduce the size of bezels corresponding to the non-display area in order to maximize the display area of the display panel. Therefore, various studies have been conducted to minimize the dead space caused by the alignment mark.

The above information disclosed in this Background section is only for understanding of the background of the inventive concepts, and, therefore, it may contain information that does not constitute prior art.

SUMMARY

Display devices constructed according to exemplary embodiments of the invention are capable of having a reduced dead space and smaller bezels for a display device.

Additional features of the inventive concepts will be set forth in the description which follows, and in part will be apparent from the description, or may be learned by practice of the inventive concepts.

According to an exemplary embodiment of the present disclosure, a display device includes a display unit including transistors disposed in a display area and signal lines arranged in a non-display area located along an edge of the display area, at least one of the signal lines being electrically connected to the transistors; and an input sensing unit disposed over the display unit and including sensing electrodes disposed on the display area, sensing lines arranged on the non-display area, and a first dummy pattern disposed on the non-display area and spaced apart from the sensing electrodes as compared with the sensing line, at least one of the sensing lines being electrically connected to the sensing electrodes, wherein the first dummy pattern overlaps a first signal line of the signal lines, the first signal line being spaced farthest from the display area, a planar shape of an overlap pattern formed by overlapping the first dummy pattern and the first signal line coincides with a planar shape of an alignment mark, the alignment mark includes a first portion having a first area and a second portion having a second area and protruding from the first portion, and a planar shape of a non-overlap portion of the first dummy pattern, not overlapping the first signal line, is the same as a planar shape of the second portion of the alignment mark.

The first dummy pattern may be isolated from the signal lines and the sensing lines.

The first signal line may extend along the edge of the display unit, forms a closed loop, and is isolated from the transistors.

The display unit may include: a semiconductor layer including a channel of each of the transistors; a first conductive layer disposed on the semiconductor layer and includes a gate electrode of each of the transistors; and a second conductive layer disposed on the first conductive layer and includes a source electrode and a drain electrode of each of the transistors, wherein the first conductive layer includes the first signal line.

The display unit may include: a semiconductor layer including a channel of each of the transistors; a first conductive layer disposed on the semiconductor layer and includes a gate electrode of each of the transistors; and a second conductive layer disposed on the first conductive layer and includes a source electrode and a drain electrode of each of the transistors, wherein the second conductive layer includes the first signal line.

The first dummy pattern and the first signal line may be configured to absorb light, a shadow image corresponding to the overlap pattern is formed when the overlap pattern is irradiated with light, and a shape of the shadow image coincides with a planar shape of the alignment mark.

The first dummy pattern may include a plurality of sub-line patterns arranged in parallel with each other.

A first side surface of the display unit adjacent to the first signal line may form an acute angle with an upper surface of the display unit, a first side surface of the input sensing unit contacting the first side surface of the display unit, may form an acute angle with the upper surface of the display unit, and a distance from the first dummy pattern to the first side surface of the input sensing unit is greater than a distance from the first signal line to the first side surface of the display unit.

The first signal line may include a third portion extending along a first direction alone which the signal lines extend, and a fourth portion protruding from the third portion in a second direction intersecting the first direction, and the first dummy pattern has a third area smaller than the second area of the alignment mark, and the fourth portion overlaps the first dummy pattern.

The input sensing unit may further include a second dummy pattern disposed on the non-display area and spaced apart from the sensing electrodes, the second dummy pattern overlaps the first signal line, the alignment mark further include a third portion having a third area and protruding from the first portion, and a planar shape of the overlap pattern formed by overlapping the first dummy pattern, the second dummy pattern, and the first signal line coincides with a planar shape of the alignment mark.

The second dummy pattern may have an area different from an area of the first dummy pattern.

The second dummy pattern may have a shape different from a shape of the first dummy pattern.

The input sensing unit may include a third dummy pattern disposed on the non-display area and spaced apart from the sensing electrodes, and the third dummy pattern overlaps the first signal line, the alignment mark further includes a fourth portion having a fourth area and protruding from the first portion, and a planar shape of the overlap pattern formed by overlapping the first dummy pattern, the second dummy pattern, the third dummy pattern, and the first signal line coincides with a planar shape of the alignment mark.

The second dummy pattern may have a shape different from a shape of the first dummy pattern, and the third dummy pattern may have a shape different from the shape of the second dummy pattern.

According to another exemplary embodiment of the present disclosure, a display device includes a display unit including transistors disposed in a display area, signal lines arranged in a non-display area located along an edge of the display area, and a first dummy line pattern disposed in the non-display area and spaced apart from the display area as compared with the signal lines, at least one of the signal lines being electrically connected to the transistors; and an input sensing unit disposed over the display unit and including sensing electrodes disposed on the display area and sensing lines arranged on the non-display area, at least one of the sensing lines being electrically connected to the sensing electrodes, wherein the first dummy line pattern overlaps a first sensing line of the signal lines, the first sensing line being spaced farthest from the display area, a planar shape of an overlap pattern formed by overlapping the first dummy line pattern and the first sensing line coincides with a planar shape of an alignment mark, the alignment mark includes a first portion having a first area and a second portion having a second area and protruding from the first portion, and a planar shape of a non-overlap portion of the first dummy line pattern, not overlapping the first sensing line, is the same as a planar shape of the second portion of the alignment mark.

The first dummy line pattern may be isolated from the signal lines and the sensing lines.

The first sensing line may be extended along an edge of the input sensing unit.

The display unit may include: a semiconductor layer includes a channel of each of the transistors; a first conductive layer disposed on the semiconductor layer and includes a gate electrode of each of the transistors; and a second conductive layer disposed on the first conductive layer and includes a source electrode and a drain electrode of each of the transistors, wherein the first conductive layer includes the first dummy line pattern.

The display unit may include: a semiconductor layer includes a channel of each of the transistors; a first conductive layer disposed on the semiconductor layer and includes a gate electrode of each of the transistors; and a second conductive layer disposed on the first conductive layer and includes a source electrode and a drain electrode of each of the transistors, wherein the second conductive layer includes the first dummy line pattern.

The display unit may further include a second dummy line pattern disposed on the non-display area and spaced apart from the display areas, and the second dummy line pattern overlaps the first sensing line, the alignment mark further includes a third portion having a third area and protruding from the first portion, and a planar shape of the overlap pattern formed by overlapping the first dummy pattern, the second dummy pattern, and the first signal line coincides with a planar shape of the alignment mark.

The input sensing unit may further include a first dummy pattern disposed on the non-display area and spaced apart from the sensing electrodes, and the first dummy pattern overlaps the first dummy line pattern, the overlap pattern is formed by overlapping the first dummy pattern, the first dummy line pattern, and the first sensing line, the first dummy pattern is smaller than the second portion of the alignment mark, and the first dummy line pattern is smaller than the second portion of the alignment mark.

According to another exemplary embodiment of the present disclosure, a display device includes a substrate including a display area and a non-display area located at one side of the display area; a circuit element layer, as a display unit disposed on the substrate, including a transistor disposed to overlap the display area, signal lines disposed on the non-display area, and a first dummy line pattern, at least one of the signal lines being electrically connected to the transistor; and a display element layer disposed on the display unit and including a light emitting element disposed to overlap the display area and electrically connected to the transistor, wherein the first dummy line pattern overlaps a first signal line of the signal lines, spaced farthest from the display area, in a thickness direction of the substrate, and is isolated from the first signal line, a planar shape of an overlap pattern formed by overlapping the first dummy line pattern and the first signal line coincides with a planar shape of an alignment mark, the alignment mark includes a first portion having a first area and a second portion having a second area and protruding from the first portion, and a planar shape of a non-overlap portion of the first dummy line pattern, not overlapping the first signal line, is the same as a planar shape of the second portion of the alignment mark.

The circuit element layer may include: a semiconductor layer disposed on the display area of the substrate; a first insulating layer disposed on the semiconductor layer and the substrate; a first conductive layer disposed on the first insulating layer and includes a gate electrode overlapping the semiconductor layer, and the first dummy line pattern; a second insulating layer disposed on the first conductive layer; and a second conductive layer disposed on the second insulating layer and includes a source electrode or a drain electrode overlapping the semiconductor layer, and the signal lines.

The circuit element layer may include: a semiconductor layer disposed on the display area of the substrate; a first insulating layer disposed on the semiconductor layer and the substrate; a first conductive layer disposed on the first insulating layer and includes a gate electrode overlapping the semiconductor layer, and the signal lines; a second insulating layer disposed on the first conductive layer; and a second conductive layer disposed on the second insulating layer and includes a source electrode or a drain electrode overlapping the semiconductor layer, and the first dummy line pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
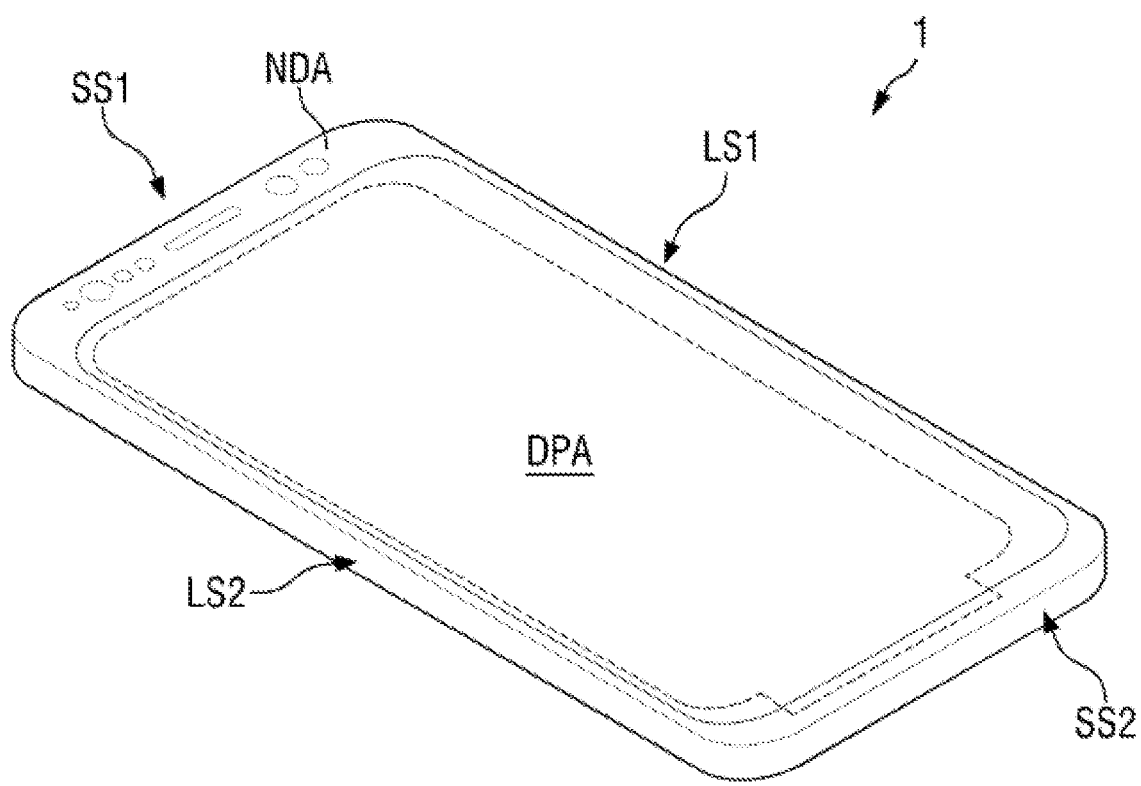
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the drawings, components may be exaggerated or reduced in size for convenience of explanation.

Throughout the specification, like reference numerals refer to like elements.

Hereinafter, exemplary embodiments of the present invention will be described with reference to the attached drawings.

Figure 2:
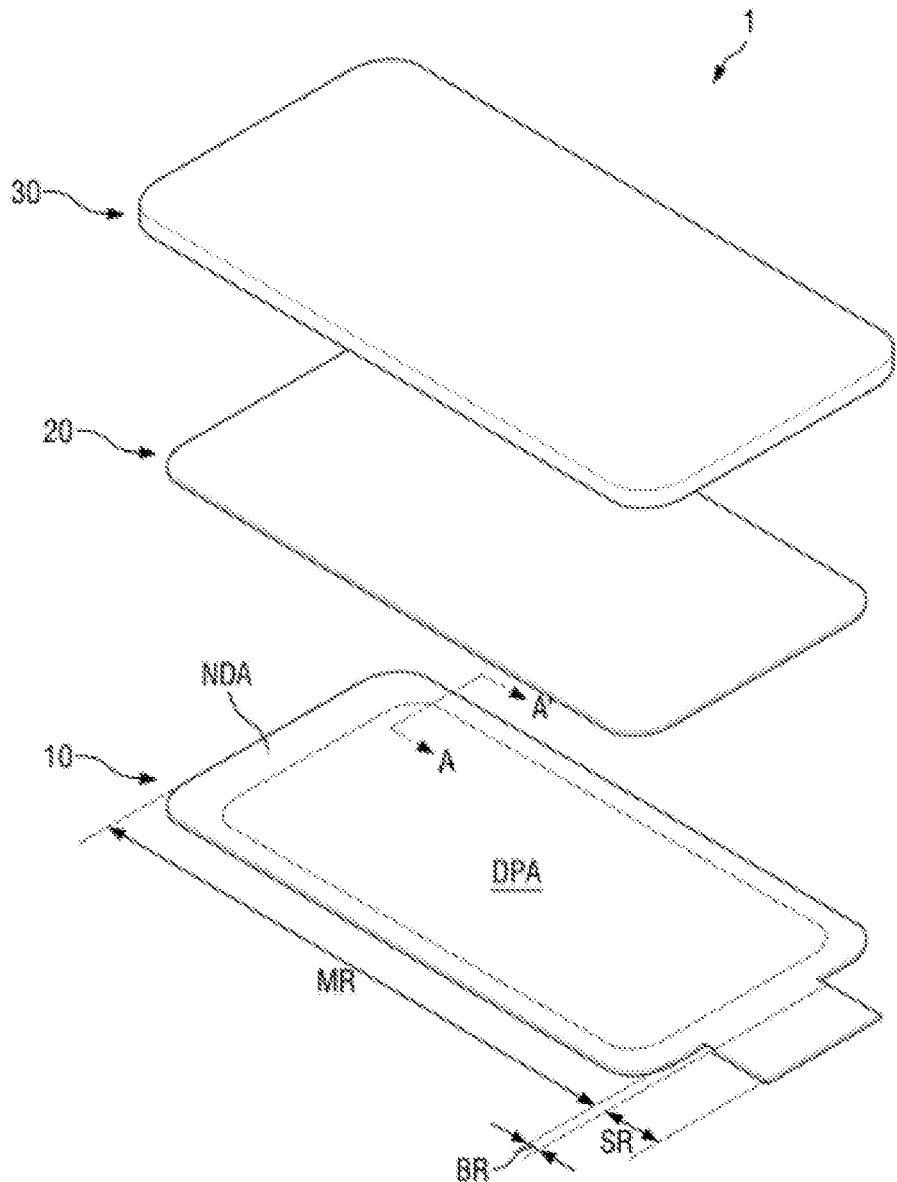
FIG. 2 is an exploded perspective view of the display device of FIG. 1.
Figure 3:
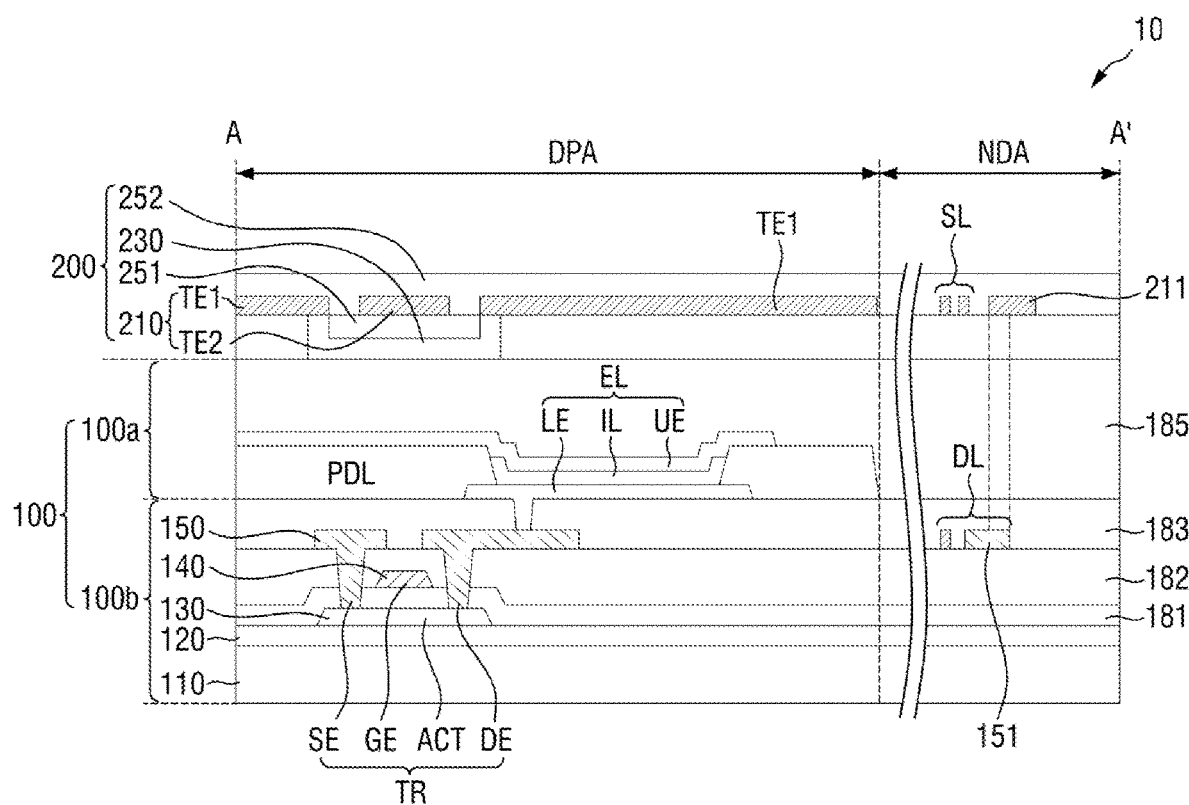
FIG. 3 is a cross-sectional view showing a display module taken along the line A-A' of FIG. 2 according to an exemplary embodiment.
Figure 4:
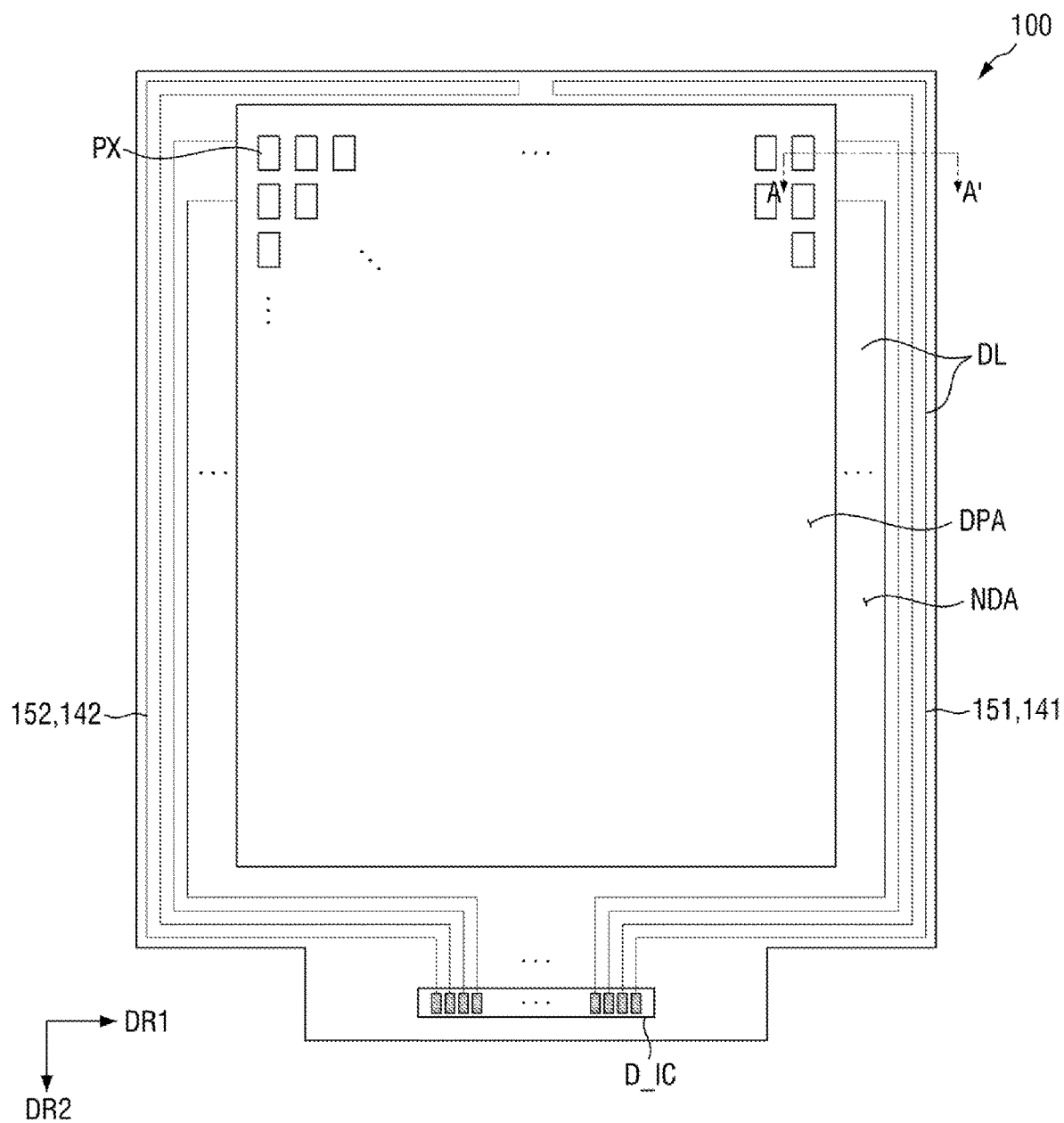
FIG. 4 is a plan view showing a display unit included in the display module of FIG. 3 according to an exemplary embodiment.
Figure 5:
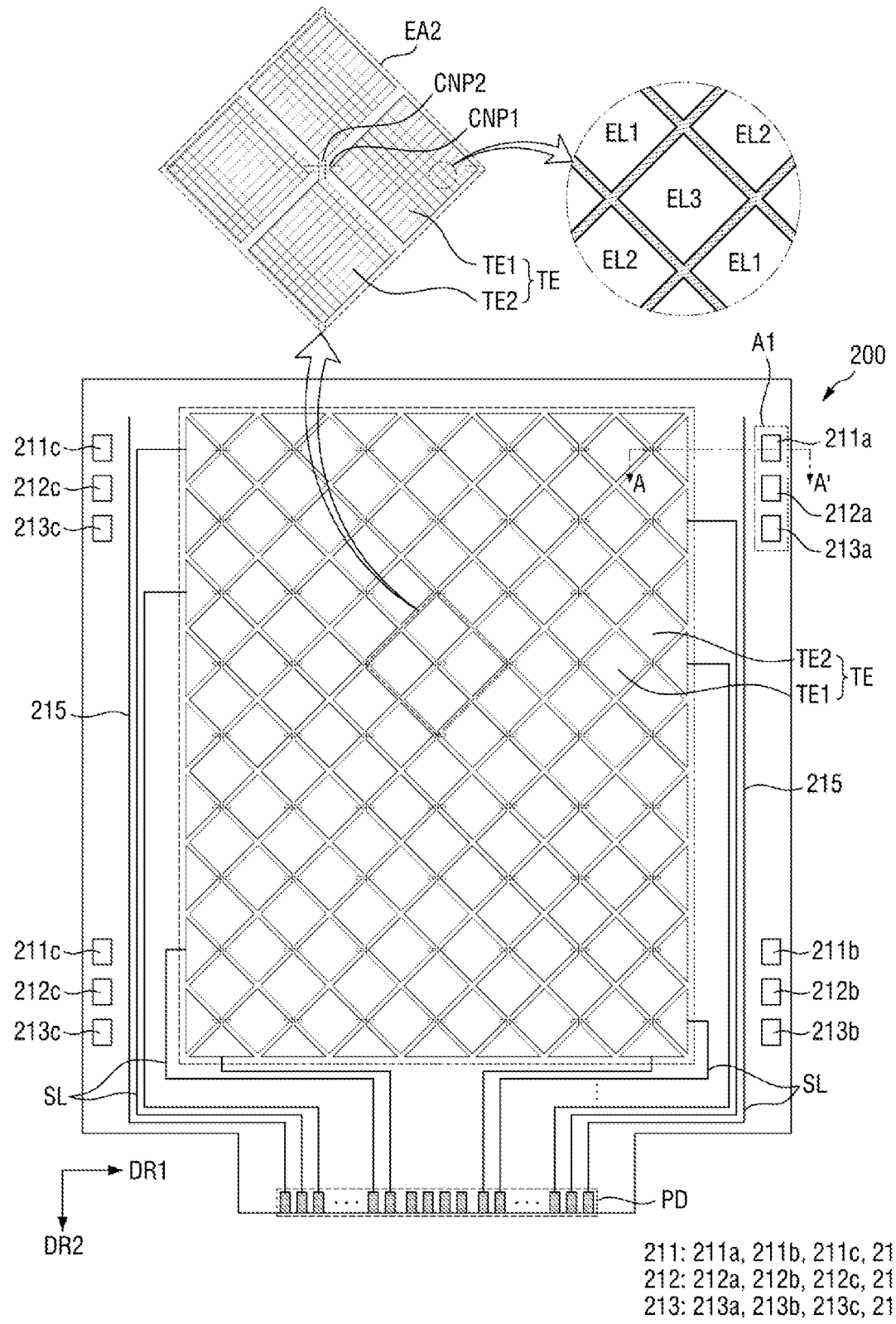
FIG. 5 is a plan view showing an input sensing unit included in the display module of FIG. 3 according to an exemplary embodiment.

FIG. 1 is a perspective view of a display device according to an exemplary embodiment. FIG. 2 is an exploded perspective view of the display device of FIG. 1. FIG. 3 is a cross-sectional view showing a display module taken along the line A-A' of FIG. 2 according to an exemplary embodiment. FIG. 4 is a plan view showing a display unit included in the display module of FIG. 3 according to an exemplary embodiment. FIG. 5 is a plan view showing an input sensing unit included in the display module of FIG. 3 according to an exemplary embodiment.

Referring to FIGS. 1 to 5, a display device 1 may display an image. The display device 1 may be a portable terminal such as a table PC, a smart phone, a personal digital assistant (PDA), a portable multimedia player (PMP), a game machine, or a wrist watch-type electronic appliance. However, the display device 1 is not limited thereto. Examples of the display device 1 may include large-sized electronic devices such as televisions and outside billboards, and small and medium-sized electronic devices such as personal computers, notebook computers, automobile navigators, and cameras.

The display device 1 may have a rectangular shape in a plan view. The display device 1 may include two long sides (that is, a first long side LS1 and a second long side LS2) and two short sides (that is, a first short side SS1 and a second short side SS2). The corners where the long sides LS1 and LS2 of the display device 1 meet and the short sides SS1 and SS2 of the display device 1 may be right angles, but may be curved as shown in FIG. 1. The planar shape of the display device 1 is not limited thereto, and the display device 1 may have a circular shape and other shapes.

The display device 1 may include a display module 10, a function module 20, and a window 30.

The display module 10 may display an image, and sense a touch input. Details of the display module 10 will be described after the function module 20 and the window 30 are described.

Unless otherwise defined, as used herein, the "on", "over", "above", "upper side", "top", or "upper surface" refers to a side of a display surface with respect to the display module 10 (or a display unit 100 included in the display module 10), and the "beneath", "under", "below", "lower side", "bottom", or "lower surface" refers to a side opposite to the display surface with respect to the display module 10.

Among the display module 10, the function module 20, and the window, the corresponding component formed together with another component through a continuous process is identified as a "layer". Among the display module 10, the function module 20, and the window 30, the component coupled with another component through an adhesive member is identified as a "panel". The "panel" includes a base layer, for example, a synthetic resin film, a composite material film, or a glass substrate, providing a base surface, but the "layer" may not include a base layer. In other words, a component identified as the "layer" is disposed on the base surface provided by another component.

The function module 20 may be disposed on the display module 10. The function module 20 may include at least one function layer.

The function layer may be a layer performing a color filtering function, a color conversion function, or a polarization function. The function layer may be a sheet layer, a film layer, a thin film layer, a coating layer, a panel, or a plate. One function layer may be formed of a single layer, but may also be formed of a plurality of laminated thin film or coating layers. For example, the function layer may be a color filter or an optical film. The function module may be omitted.

The window 30 may be disposed on the function module 20 (or the display module 10). The window 30 may be disposed to overlap the display module 10 and cover the front surface of the display module 10. The window 30 may be larger than the display module 10. For example, at both short sides of the display device 1, the window 30 may protrude outward from the display module 10. Even at both long sides of the display device 1, the window 30 may protrude outward from the display module 10. The window 30 may further protrude outward from the display module 10 at both short sides of the display device 1 as compared with at both long side of the display device 1.

The window 30 may include a central portion and a light blocking pattern. The central portion may overlap a display area DPA (or display portion) of the display module 10 and transmit light emitted from the display area DPA. The light blocking pattern may be located at the edge of the window 30. The light blocking pattern may overlap a non-display area NDA (or non-display portion) of the display module 10 and prevent the non-display area NDA from being viewed.

The function module 20 and the window 30 may be coupled to the display module 10 through an optical clear adhesive (OCA) or an optical clear resin (OCR).

The display module 10 may include a display unit 100 (or a display panel) and an input sensing unit 200 (or a touch screen panel).

The display unit 100 may be an organic light emitting display panel, but the present invention is not limited thereto. For example, the display unit 100 may be different kinds of display panels, such as a liquid crystal display panel, an electrophoretic display panel, and a plasma display panel.

The display unit 100 may include a display area DPA and a non-display area NDA. The display area DPA is an area where an image is displayed, and the non-display area NDA is an area where an image is not displayed.

The display area DPA may be located at the center of the display unit 100, and may have a relatively larger area than the non-display area NDA. A pixel PX to be described later may be disposed in the display area DPA. The display area DPA may have a rectangular shape or a rectangular shape having rounded corners. However, the present invention is not limited thereto, and the display area DPA may have other various shapes such as a square, a polygon, a circle, and an ellipse. Further, the display area DA may include a plurality of sub-display areas spaced apart from each other.

The non-display area NDA may be disposed around the display area DPA. The non-display area NDA may be an area from the outer boundary of the display area DPA to the edge of the display unit 100. The non-display area may be provided with a signal line (for example, a data line) for applying a signal to the display area DPA (or a pixel PX disposed in the display area DPA) or a driving circuit (for example, a driving integrated circuit D_IC. Further, the non-display area NDA may be provided with an outermost black matrix.

As shown in FIG. 3, the display unit 100 may include a display element layer 100a and a circuit element layer 100b.

The circuit element layer 100b may include a first substrate 110, a buffer layer 120, a semiconductor layer 130, a first insulating layer 181, a first conductive layer 140, a second insulating layer 182, a second conductive layer 150, and a third insulating layer 183. The display element layer 100a may include a light emitting element EL and an encapsulation layer 185 (or a thin film encapsulation layer).

The first substrate 110 may be made of an insulating material such as glass or resin. The first substrate 110 may be made of a material having flexibility so as to be bent or folded, and may have a single-layer structure or a multi-layer structure.

For example, the material having flexibility may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the first substrate 110 is not limited thereto. For example, the first substrate 110 may be made of fiber glass reinforced plastic.

The buffer layer 120 may be disposed on the entire surface of the first substrate 110. The buffer layer 120 may prevent the diffusion of impurity ions, may prevent the penetration of moisture or external air, and may perform a surface planarization function. The buffer layer 120 may include silicon nitride, silicon oxide, or silicon oxynitride. The buffer layer 120 may be omitted depending on the kind of the first substrate 110, process conditions, or the like.

The semiconductor layer 130 may be disposed on the buffer layer 120 (or the first substrate 110). The semiconductor layer 130 may be an active layer constituting a channel of a transistor TR. The semiconductor layer 130 may include a source region and a drain region which contact a source electrode SE and a drain electrode DE, which will be described later. The region between the source region and the drain region may be a channel region ACT.

The semiconductor layer 130 may include polysilicon, amorphous silicon, or an oxide semiconductor. The channel region ACT of the semiconductor layer 130 may be a semiconductor pattern not doped with impurities, and may be made of an intrinsic semiconductor. The source region and the drain region may be semiconductor patterns doped with impurities. As the impurities, n-type impurities, p-type impurities, and other metal impurities may be used.

The first insulating layer 181 (or a gate insulating layer) may be disposed on the semiconductor layer 130 and the buffer layer 120 (or the first substrate 110). The first insulating layer 181 may be generally disposed over the entire surface of the first substrate 110. The first insulating layer 181 may be a gate insulating film having a gate insulating function.

The first insulating layer 181 may include an inorganic insulating material such as a silicon compound or a metal oxide. For example, the first insulating layer 181 may include silicon oxide, silicon nitride, silicon oxynitride, aluminum oxide, tantalum oxide, hafnium oxide, zirconium oxide, titanium oxide, or a combination thereof. The first insulating layer 181 may be a single-layer film or a multi-layer film composed of a laminated film of different materials.

The first conductive layer 140 may be disposed on the first insulating layer 181. The first conductive layer 140 may include a gate electrode GE. The gate electrode GE may be s disposed to overlap the semiconductor layer 130 (or the channel region ACT of the semiconductor layer 130).

The first conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer 140 may have a single-layer film structure or a multi-layer film structure.

The first conductive layer 140 may further include a gate line. The gate line may be electrically connected to the gate electrode GE, may extend to the non-display area NDA of the display unit 100, and may be electrically connected to the driving integrated circuit D_IC. The gate line may transmit a gate signal provided from the driving integrated circuit D_IC to the gate electrode GE of the transistor TR.

The second insulating layer 182 (or an interlayer insulating layer) is disposed on the first conductive layer 140, and may be generally disposed over the entire surface of the substrate 110. The second insulating layer 182 may serve to insulate the first conductive layer 140 from the second conductive layer 150, and may be an interlayer insulating film.

The second insulating layer 182 may include an inorganic insulating material such as silicon oxide, silicon nitride, silicon oxynitride, hafnium oxide, aluminum oxide, titanium oxide, tantalum oxide, or zinc oxide, or may include an organic insulating material such as polyacrylate resin, epoxy resin, phenolic resin, polyamide resin, polyimide rein, unsaturated polyester resin, poly phenylenether resin, polyphenylene sulfide resin, or benzocyclobutene (BCB). The second insulating layer 182 may be a single-layer film or a multi-layer film composed of a laminated film of different materials.

The second conductive layer 150 may be disposed on the second insulating layer 182. The second conductive layer 150 may include a source electrode SE, a drain electrode DE, and signal lines DL.

The source electrode SE and the drain electrode DE may be respectively in contact with the source region and the drain region of the semiconductor pattern through a contact hole penetrating the second insulating layer 182 and the first insulating layer 181.

At least one of the signal lines DL may be electrically connected to the source electrode SE or the drain electrode DE of the transistor TR, may extend to the non-display area NDA of the display unit 100, and may electrically connected to the driving integrated circuit D_IC. The data line may transmit a data signal provided from the driving integrated circuit D_IC to the source electrode SE of the transistor TR.

As shown in FIG. 4, each of the first signal line 151 and the second signal line 152 may be disposed to be spaced farthest from the display area DA in the non-display area DPA of the display unit 100, or may be disposed adjacent to the edge of the display unit 100. For example, each of the first signal line 151 and the second signal line 152 may be a defect detection line (line crack detection line) for detecting the defect (for example, line crack) of the display unit 100 (or the display module 10), and may be disposed at the outermost periphery of the display unit 100.

The first signal line 151 and the second signal line 152 partially overlap the dummy patterns 211, 212, and 213 of the input sensing unit 200 to be described later to form an alignment mark or function as an alignment mark in a plan view.

The second conductive layer 150, similarly to the first conductive layer 140, may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer 150 may have a single-layer film structure or a multi-layer film structure.

The third insulating layer 183 (or a protective layer) may be disposed on the second conductive layer 150 and the second insulating layer 182.

The circuit element layer 110a may be disposed on the third insulating layer 183.

The circuit element layer 110a may include a first electrode layer, a pixel defining layer PDL, a light emitting layer IL (or an intermediate layer), and a second electrode layer including a second electrode UE (or an upper electrode).

The first electrode layer is disposed on the encapsulation layer 185 and may include a first electrode LE of the light emitting element EL. The first electrode LE may be electrically connected to the drain electrode DE of the transistor TR through a contact hole penetrating the third insulating layer 183.

The pixel defining layer PDL may be disposed along the edge of the first electrode LE, and may include an organic insulating material.

The light emitting layer IL may be disposed on the first electrode LE exposed by the pixel defining layer PDL. The light emitting layer IL may include a low-molecular material or a high-molecular material.

The second electrode layer is disposed on the light emitting layer IL, and may include a second electrode UE of the light emitting element EL. The second electrode UE may be a common electrode formed entirely on the light emitting layer IL and the pixel defining layer PDL. The second electrode UE may be a transparent or semi-transparent electrode.

Any one of the first electrode LE and the second electrode UE may be an anode electrode, and the other one thereof may be a cathode electrode. For example, the first electrode LE may be an anode electrode, and the second electrode UE may be a cathode electrode.

The encapsulation layer 185 may be disposed on the second electrode layer. The encapsulation layer 185 may prevent external moisture and air from penetrating the light emitting element EL. The encapsulation layer 185 may be a thin film encapsulation layer, and may include at least on organic film and at least one inorganic film. The organic film may include any one selected from epoxy, acrylate, and urethane acrylate, and the inorganic film may include any one selected from silicon oxide (SiOx), silicon nitride (SiNx), and silicon oxynitride (SiONx).

The input sensing unit 200 may be disposed on the display unit 100 (or the encapsulation layer 185). The input sensing unit 200 may be disposed on the display surface of the display unit 100 (i.e., the surface from which an image is emitted). The input sensing unit 200 may receive a touch input from the outside (e.g., a user's hand or a separate input unit), or may recognize a touch event. The input sensing unit 200 may be driven by a mutual capacitance method or a self capacitance method.

The input sensing unit 200 may be formed together with the display unit 100 through a continuous process.

Referring to FIG. 5, the input sensing unit 200 may include a sensing area SA and a non-sensing area NSA. The sensing area SA may correspond to the display area DPA of the display unit 100, and the non-sensing area NSA may correspond to the non-display area NDA of the display unit 100.

The sensing area SA may be provided with a sensing electrode TE (or a touch electrode), and the non-sensing area NSA may be provided with sensing lines SL, a pad portion PD, and dummy patterns 211, 212, and 213.

The sensing electrode TE may include a first sensing electrode TE1 and a second sensing electrode TE2. The first sensing electrodes TE1 and the second sensing electrodes TE2 may be arranged alternately, and may be connected to each other in different directions.

The first sensing electrodes TE1 may be arranged in a matrix form, may be electrically connected to each other along the first direction DR1, and may form sensing electrode rows that are parallel to each other. In one sensing electrode row, the first sensing electrode TE1 may be electrically connected to the adjacent sensing electrode through a first connection pattern CNP1.

The second sensing electrodes TE2 may be arranged in a matrix form, may be electrically connected to each other along the second direction DR2, and may form sensing electrode columns that are parallel to each other. In one sensing electrode column, the second sensing electrode TE2 may be electrically connected to the adjacent sensing electrode through a second connection pattern CNP2 (a bridge pattern).

The first sensing electrodes TE1 (or the sensing electrode rows) and the second sensing electrode TE2 (or the sensing electrode columns) are electrically connected to the sensing pads included in the pad portion PD through sensing lines SL.

As shown in FIG. 5, the sensing electrode TE may have a mesh shape. When the sensing electrode TE has a mesh shape, parasitic capacitance with electrodes included in the display unit 100 (for example, a gate electrode, a source electrode, and the like of the transistor TR) may be reduced. The sensing electrode TE may not overlap the light emitting elements EL1, EL2, and EL3, and, in this case, the sensing electrode TE may not be visible to a user of the display device 1.

The mesh-shaped sensing electrode TE may include silver, aluminum, copper, chromium, nickel, or titanium, which can be subjected to a low-temperature process. In this case, even when the input sensing unit 200 is formed in a continuous process, it is possible to prevent the damage to the display unit 100 (or the light emitting element EL in the display unit 100).

The sensing lines SL may electrically connect the sensing electrode TE and the pad portion PD (or a driving circuit). The sensing lines SL may transmit a sensing input signal from the driving circuit to the sensing electrode TE through the pad portion PD, or may transmit a sensing output signal from the sensing electrode TE to the driving circuit through the pad portion PD.

The dummy patterns 211, 212, and 213 may be formed independently of each other, such as an island pattern, and may be electrically separated from or insulated from the sensing lines SL. The dummy patterns 211, 212 and 213 may arranged at the outermost periphery in the non-sensing area NSA of the input sensing unit 200 (or the non-display area NDA of the display unit 100), and may be spaced apart from the sensing electrode TE as compared with the sensing lines SL. For example, the dummy patterns 211, 212 and 213 may be arranged adjacent to the first side of the input sensing unit 200 (for example, the first long side LS1 of the display device 1). Further, the dummy patterns 211, 212, and 213 may be respectively disposed in the alignment mark detection areas defined adjacent to the four corners of the input sensing unit 200.

The dummy patterns 211, 212 and 213 may partially overlap the signal lines DL (for example, the first signal line 151) included in the display unit 100, and may form one alignment mark or function as one alignment mark. Here, the alignment mark (or alignment key) may be used as an identification mark for recognizing the position of the display module 10 or aligning the display module 10 in the process of attaching the display module 10 to the window 30 (or the function module 20). Further, the alignment mark may be used to define a bezel in the display device 1. The alignment mark may be provided in various shapes. Although it is shown in FIG. 5 that the dummy patterns 211, 212 and 213 are disposed adjacent to the long sides LS1 and LS2 of the display module 10, the present invention is not limited thereto. For example, the dummy patterns 211, 212 and 213 may be disposed adjacent to the short sides SS1 and SS2 of the display module 10. Details of the dummy patterns 211, 212 and 213 functioning as the alignment mark will be described with reference to FIGS. 6A to 9.

Each of the sensing lines SL and the dummy patterns 211, 212 and 213, similarly to the first conductive layer 140, may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may have a single-layer film structure or a multi-layer film structure.

Referring to FIG. 3 again, the input sensing unit 200 may include a second substrate, a third conductive layer 230, a fourth insulating layer 251, a fourth conductive layer 210, and a fifth insulating layer 252.

The second substrate may include at least one of an organic insulating material and an inorganic insulating material. The second substrate may be included in the encapsulation layer 185 (i.e., an encapsulating layer in which at least one organic layer and at least one inorganic layer are alternately laminated).

The third conductive layer 230 may be disposed on the second substrate (or the encapsulation layer 185), and may include a first connection pattern CNP1. The first connection pattern CNP1 may be electrically connected to the first electrode TE1 through a contact hole penetrating the fourth insulating layer 251.

The fourth insulating layer 251 may be disposed on the third conductive layer 230. Further, the fourth insulating layer 251 may be disposed on the second substrate (or the encapsulation layer 185) partially exposed by the third conductive layer 230.

The fourth conductive layer 210 may include a first electrode TE1, a second electrode TE2, and sensing lines SL. The fourth conductive layer 210 may include dummy patterns 211, 212, and 213.

As described above, the first electrode TE1 and the second electrode TE2 may be disposed in the sensing area SA of the input sensing unit 200 (or the display area DPA of the display unit 100), and the sensing lines SL and the dummy patterns 211, 212 and 213 may be disposed in the non-sensing area NSA of the input sensing unit 200 (or the non-display area NDA of the display unit 100).

The dummy patterns 211, 212, and 213 may partially overlap the first signal line 151.

The fifth insulating layer 252 may be disposed on the fourth conductive layer 210, and may be disposed over the entire surface of the encapsulation layer 185.

As described above, the display module 10 may include a display unit 100 and an input sensing unit 200. The display unit 100 may include a first signal line 151 (or an outermost line) disposed in the non-display area NDA. The input sensing unit 200 may include dummy patterns 211, 212, and 213 independently disposed in the non-display area NDA (i.e., having an island pattern shape electrically isolated from the sensing lines SL). At least one of the dummy patterns 211, 212, and 213 may partially overlap the first signal line 151 in a plan view, and may form an alignment mark or function as an alignment mark together with the first signal line 151.

When the alignment mark of the display module 10 is formed by partially including the outermost line (for example, the first signal line 151) of the display module 10, the dead space of the display module 10 may be reduced, compared to when the alignment mark is formed independently to be spaced apart from the outermost line in the non-display area NDA of the display module 10.

When the dummy patterns 211, 212, and 213 are disposed on a different layer from the first signal line 151, and are electrically isolated from the first signal line 151, the alignment mark is prevented from acting as a static charge path to signal lines DL (for example, data lines, gate lines, and the like), but more sufficient insulating characteristics can be ensured, and damages of the display module 10 due to static electricity (for example, damages of the first signal line 151 and other components adjacent to the first signal line 151) can be prevented more effectively, as compared with a line pattern disposed on the same layer as the first signal line 151 (that is, a pattern constituting the alignment mark together with the first signal line 151).

Moreover, in a plan view, the dummy patterns 211, 212, and 213 overlap the first signal line 151 to form one alignment mark, so that this alignment mark may be detected more accurately and rapidly as compared with a partially divided alignment mark.

Meanwhile, although it is shown in FIGS. 1 to 5 that three dummy patterns 211, 212, and 213 are disposed in one alignment mark detection area, the present invention is not limited thereto. For example, one, two, or four or more metal patterns may be disposed in one alignment mark detection area.

Further, although it is shown in FIGS. 1 to 5 that the first signal line 151 of the display unit 100 and the dummy patterns 211, 212, and 213 of the input sensing unit 200 constitutes an alignment mark, the present invention is not limited thereto. For example, the outermost line closest to any one side (for example, the first long side LS1) of the display module 10 (for example, any one of a gate line, a data line, and a sensing line, which are disposed on different layers from each other) and dummy patterns (or metal patterns, for example, metal patterns disposed on any one of a first conductive layer, and a second conductive layer, and a third conductive layer) may constitute an alignment mark. Details thereof will be described later with reference to FIGS. 12 to 28.

Figure 6A:
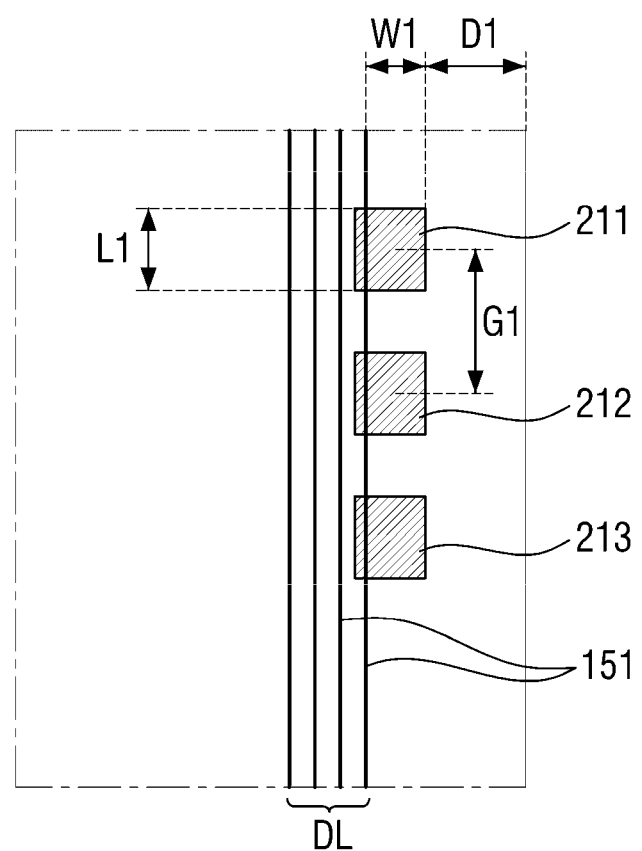
FIGS. 6A to 6C are enlarged views of the area A1 of FIG. 3.
Figure 6B:
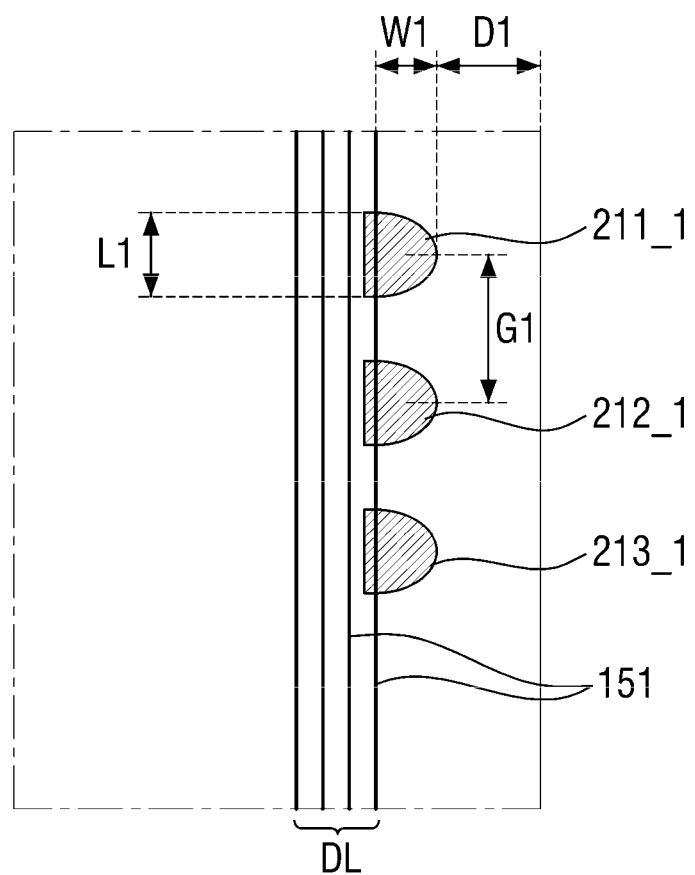
Figure 6C:
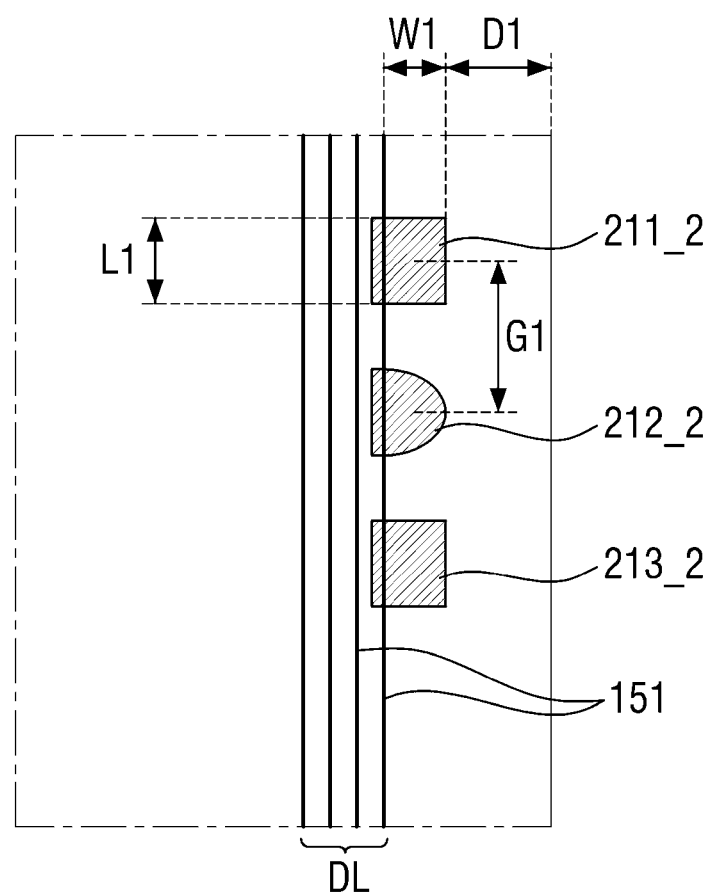
Figure 7:
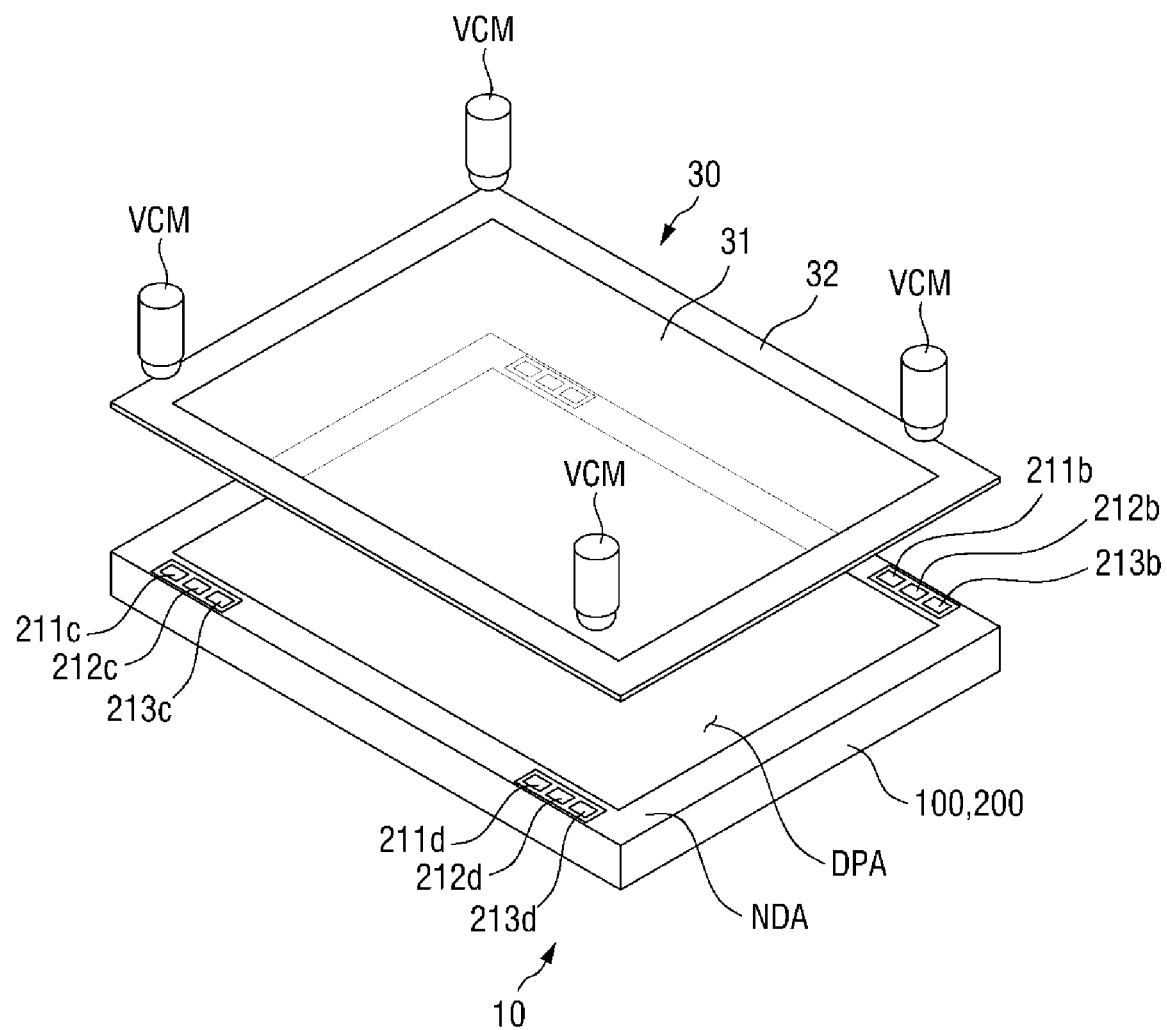
FIG. 7 is a perspective view illustrating a process of aligning a display module and a window included in the display device of FIG. 2.
Figure 8:
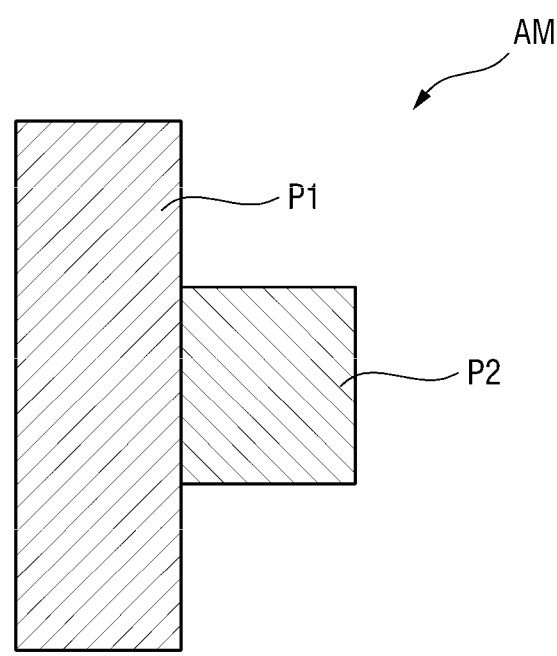
FIG. 8 is a view showing an alignment mark used in the aligning process of FIG. 7 according to an exemplary embodiment.
Figure 9:
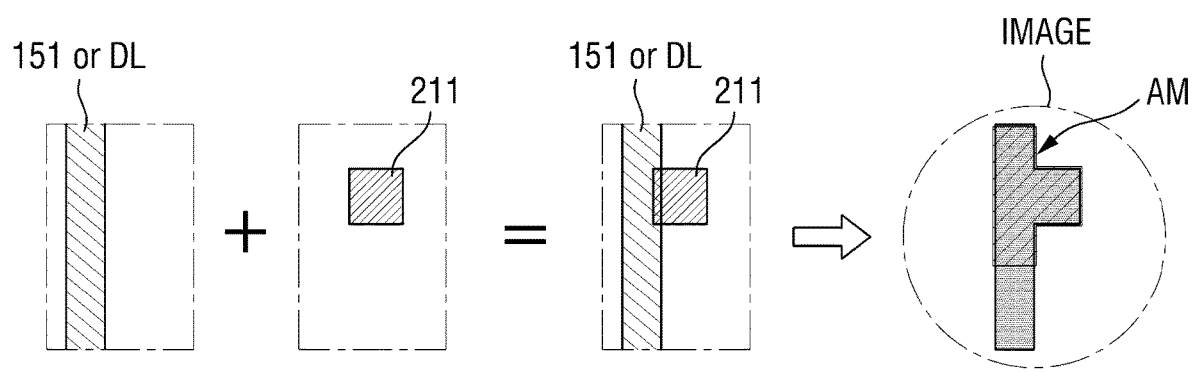
FIG. 9 is a view showing an alignment mark image recognized by a vision camera according to an exemplary embodiment.

FIGS. 6A to 6C are enlarged views of the area A1 of FIG. 3. FIG. 7 is a perspective view illustrating a process of aligning a display module and a window included in the display device of FIG. 2. FIG. 8 is a view showing an alignment mark used in the aligning process of FIG. 7 according to an exemplary embodiment. FIG. 9 is a view showing an alignment mark image recognized by a vision camera according to an exemplary embodiment.

Referring to FIGS. 6A to 6C, the signal lines DL including the first signal line 151 may extend in a second direction (or a vertical direction in FIG. 6A), and may be disposed to be spaced apart from each other along a first direction (or a horizontal direction in FIG. 6A).

In FIG. 6A, the area A1 of FIG. 5 is enlarged and shown, and thus signal lines DL are visually distinguished from each other. However, the signal lines DL including the first signal line 151 may be recognized as one line or surface having a predetermined width (for example, 50 um or more) depending on the viewing angle and resolution of a vision camera (VCM) to be described with reference to FIG. 7.

The dummy patterns 211, 212, and 213 may be spaced apart from each other along the second direction (or the vertical direction), and may overlap the first signal line 151.

Each of the dummy patterns 211, 212, and 213 has a rectangular planar shape, but is not limited thereto. For example, as shown in FIG. 6B, each of dummy patterns 211_1, 212_1, and 213_1, may have a semicircular planar shape, or may have various shapes such as a circle, a trapezoid, a "C" shape, a "L" shape, and star. Further, as shown in FIG. 6C, dummy patterns 211_2, 212_2, and 213_3 may have different shapes from each other, and may have different sizes from each other.

Hereinafter, it will be illustrated and described that the dummy patterns 211, 212, and 213 have the same shape as each other. The same features of the dummy patterns 211, 212, and 213 will be described based on the first dummy pattern 211.

The first dummy pattern 211 may have a first length L1 in the first direction, and may have a first width W1 in the second direction.

Since the dead space of the display module 10 corresponds to or is proportional to a distance from the first signal line 151 (or signal lines DL) to one lateral side of the display module 10, the first width W1 of the first dummy pattern 211 may be more restrictive than the first length L1. Thus, the first length L1 of the first dummy pattern 211 may be larger than the first width W1 thereof. For example, the first length L1 of the first dummy pattern 211 may be about 100 um, and the first width W1 thereof may be about 50 um. However, the present invention is not limited thereto. Further, as the resolution of the vision camera VCM increases, the first width W1 (and the first length L1) of the first dummy pattern 211 decreases.

The first dummy pattern 211 may be spaced apart from one lateral side (for example, first long side LS1) by a first distance D1. The first distance D1 is larger than the first width W1 of the first dummy pattern 211. For example, the first distance D1 may be about 100 um, but is not limited thereto.

The distance from the center of the first dummy pattern 211 to the center of the second dummy pattern 212 is larger than the first length L1 of the first dummy pattern 211, and for example, may be about 200 um. In this case, the distance between the first dummy pattern 211 and the second dummy pattern 212 is about 100 um, which is equal to the first length L1 of the first dummy pattern 211.

Referring to FIG. 7, vision cameras VCM may be disposed on one side of the display module 10 (for example, a display surface of the display module 10). Further, the vision cameras VCM may be disposed on the window 30. The vision cameras VCM may be disposed corresponding to the non-display area NDA of the display module 10.

The vision camera acquires an alignment mark image on an alignment mark area of the display module 10 (that is, an area where an alignment mark is disposed, for example, an area where dummy patterns 211, 212, and 213 are disposed) by light emitted from a light source. The aligning device may detect an alignment mark AM shown in FIG. 8 from the alignment mark image acquired by the vision camera VCM, may determine whether or not the display module 10 is aligned with the window 30 based on the detected alignment mark AM, and may couple the window 30 with the display module 10 when it is determined that the display module 10 is aligned with the window 30.

The light source may be disposed on the other lateral side (for example, back side) of the display module 10, and the vision camera VCM may acquire an alignment mark image including shadows of the signal lines DL and the dummy patterns 211, 212, and 213. The signal lines DL and the dummy patterns 211, 212, and 213, functioning as the alignment mark AM, may be disposed on different layers from each other, and may have different reflection characteristics from each other depending on the materials of the signal lines DL and the dummy patterns 211, 212, and 213.

Therefore, the vision camera VCM may acquire an alignment mark image including shadows of the signal lines DL and the dummy patterns 211, 212, and 213 instead of an image of light reflected by the signal lines DL and the dummy patterns 211, 212, and 213, and in this case, the accuracy for detecting the alignment mark AM can be improved, and the recognition/detection speed of the alignment mark AM can be improved.

However, the present invention is not limited thereto. For example, the light source may be disposed on one side (for example, display surface) of the display module 10, and the vision camera VCM may acquire an alignment mark image by the light reflected by the signal lines DL and the dummy patterns 211, 212, and 213.

Referring to FIG. 8, the alignment mark AM may include a first portion P1 and a second portion P2. The first portion P1 may have a first area, for example, a rectangular shape in a plan view. The second portion P1 may have a second area smaller than the first area, may protrude from one side of the first portion P1, and may have, for example, a square shape in a plan view.

Referring to FIG. 9, the shadow of the first signal line 151 (or signal lines DL) and the shadow of the first dummy pattern 211 partially overlap each other, so as to form an alignment mark image IMAGE (or an overlap pattern) having one protrusion (for example, a protrusion protruding in a horizontal direction). In this case, the aligning device may extract feature points (for example, inflection points or shapes thereof) of the alignment mark image IMAGE to match the extracted feature points with predetermined feature points or may match the alignment mark image IMAGE with a predetermined reference alignment image (that is, the alignment mark AM shown in FIG. 8) to calculate a matching score (or similarity), and may recognize an alignment mark based on the matching score. As shown in FIG. 9, the planar shape of the overlap pattern formed by overlapping the first signal line 151 and the first dummy pattern 211 may coincide with the planar shape of the alignment mark AM. In particular, the planar shape of the non-overlap portion of the first dummy pattern 211 in which the first dummy pattern 211 does not overlap the first signal line 151 may be the same as the planar shape of the second portion P2 of the alignment mark AM. Thus, the aligning device may detect the overlap pattern as the alignment mark AM.

As described with reference to FIGS. 6A to 9, the shadow of the first signal line 151 overlaps the shadow of the first dummy pattern 211 to form an alignment mark image IMAGE.

Figure 10:
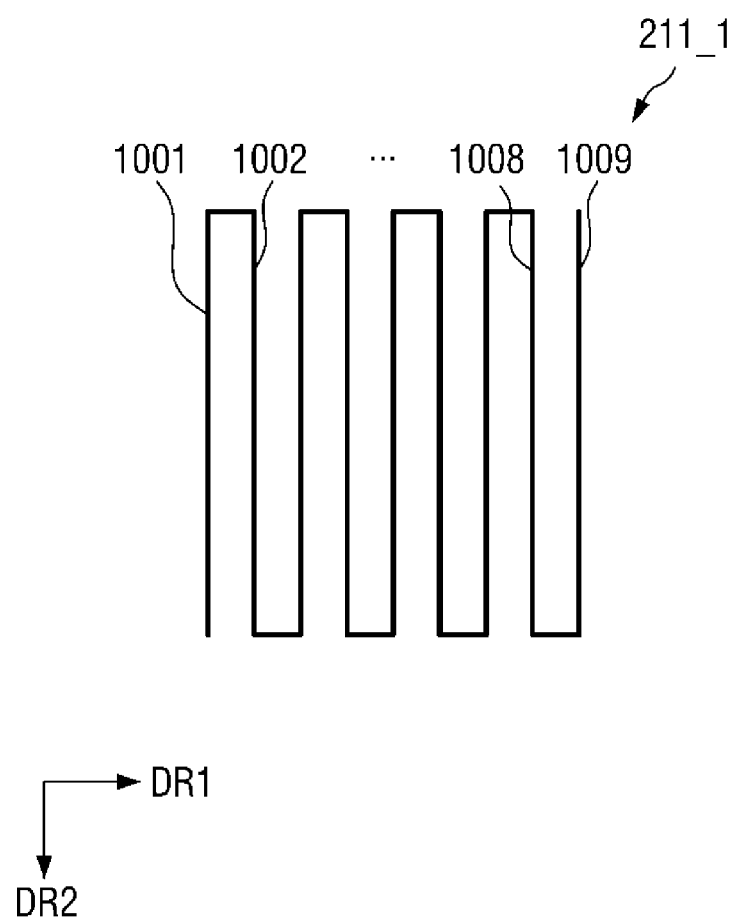
FIG. 10 is a view showing a dummy pattern included in the input sensing unit of FIG. 5 according to an exemplary embodiment.

FIG. 10 is a view showing a dummy pattern included in the input sensing unit of FIG. 5 according to an exemplary embodiment.

Referring to FIG. 10, a first dummy pattern 211_1 may be substantially the same as the first dummy pattern 211 described with reference to FIG. 5 except for shape. Therefore, a redundant description will not be repeated.

The first dummy pattern 211 may have a rectangular planar shape, and the first dummy pattern 211_1 may be a metal line extending in a zigzag shape in a quadrangle. For example, the first dummy pattern 211_1 may include sub-line patterns 1001 to 1009 in parallel with each other.

As described above, the lines adjacent to each other at specific intervals may be recognized as one line or surface depending on the resolution of the vision camera VCM. For example, the vision camera VCM spaced apart from the display module 10 by a specific distance has a maximum resolution of 3 um, the sub-line patterns 1001 to 1009 of the first dummy pattern 211_1 may be spaced apart from each other by a distance of for example, 2 um, which is smaller than that the resolution of the vision camera VCM. In this case, the first dummy pattern 211_1 may be recognized as one surface by the vision camera VCM.

Meanwhile, the first dummy pattern 211_1 may be partially disconnected. For example, the sub-line patterns 1001 to 1009 included in the first dummy pattern 211_1 may be electrically isolated from each other. As the line width of the first dummy pattern 211_1 decreases and the first dummy pattern 211_1 is partially disconnected, the resistance between specific points of the first dummy pattern 211_1 increases, and thus the inflow of static electricity or the like may be more effectively prevented.

Figure 11:
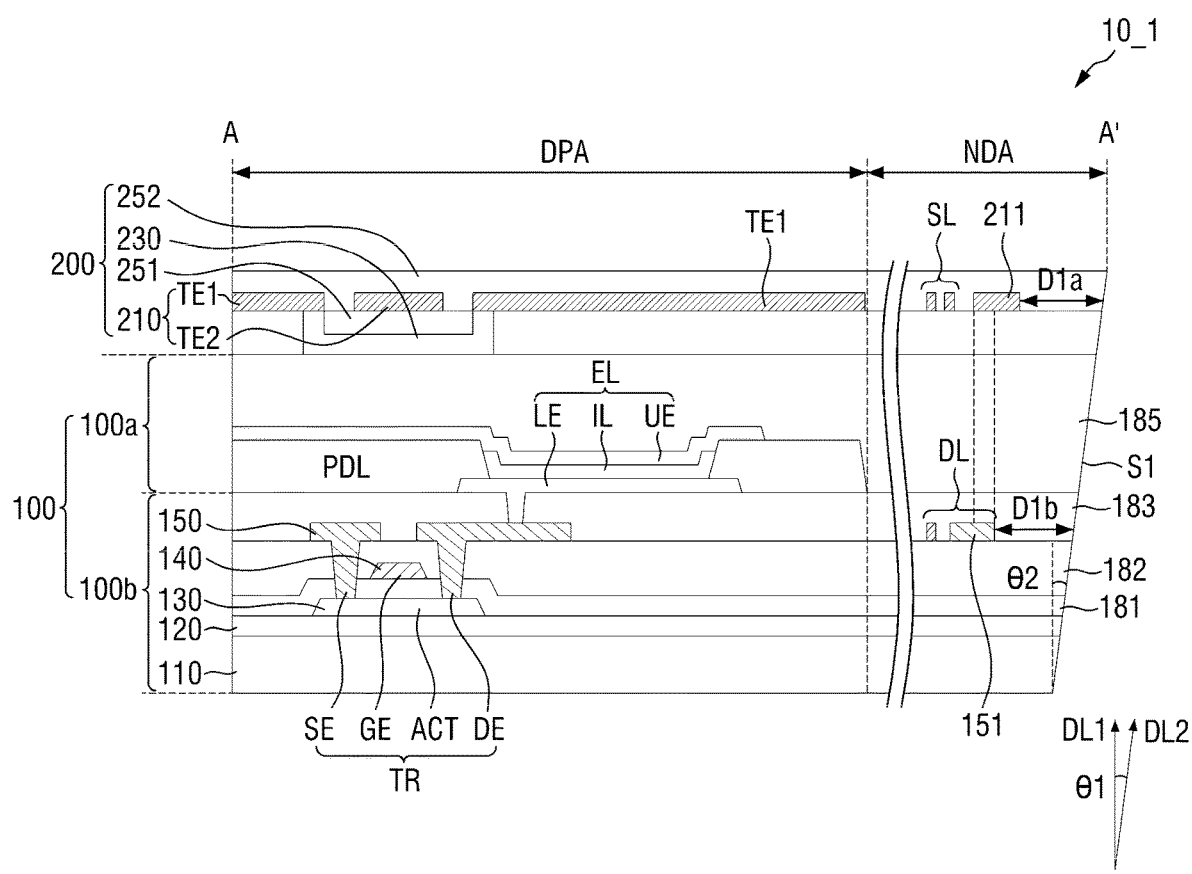
FIG. 11 is a cross-sectional view showing a display module according to an exemplary embodiment.

FIG. 11 is a cross-sectional view showing a display module according to an exemplary embodiment.

Referring to FIGS. 3 and 11, a display module 10_1 is different from the display module 10 of FIG. 3 in that it includes an inclined side surface S1.

The display module 10_1 (or the display device 1) may be processed (or cut) using a laser. For example, after the display module 10_1 is attached to the window 30 described with reference to FIG. 2, the side surface S1 thereof may be processed using a laser.

Laser light may be applied toward the back surface of the display module 10_1 in a first traveling direction DL1 or a second traveling direction DL2. Here, the first traveling direction DL1 is the same as a direction in which light is emitted from the display module 10_1, and the second traveling direction DL2 may form a first specific angle θ1 toward the outside of the display module 10_1 based on the first traveling direction DL1. For example, the first specific angle θ1 may be in a range of 0.1° to 5°, 0.3° to 3°, or 0.5° to 2°. When the laser light is applied in the first traveling direction DL1 or the second traveling direction DL2, the display area DPA of the display module 10_1 may not be damaged even when the laser is reflected by the first electrode LE or second electrode UE included in the display module 10_1.

Upon laser cutting of the display module 10_1, a laser traveling in the first moving direction DL1 or the second moving direction DL2 is used, and the back surface of the display module 10_1 receives a relatively large amount of energy, so that the side surface S1 (or laser etched surface) of the display module 10_1 may have a reverse tilted structure. The side surface S1 of the display module 10_1 may form a second specific angle θ2 toward the outside of the display module 10_1 based on the first moving direction DL1. For example, the second specific angle θ2 may be in a range of 3° to 5°.

When the first dummy pattern 211 is formed on the fourth conductive layer 210 of the input sensing unit 200, the side surface S1 of the display module 10_1 may be located relatively inside the display module 10_1, as compared with a general display module (for example, a display module in which one alignment mark is formed on the second conductive layer 150). Therefore, the dead space of the display module 10_1 may be reduced.

When the second specific angle θ2 may be in a range of 3° to 5°, the first distance D1a by which the first dummy pattern 211 is spaced apart from the side surface S1 of the display module 10_1 may be equal to or greater than the second distance D1b by which the first signal line 151 is spaced apart from the side surface S1 of the display module 10_1. That is, when the first dummy pattern 211 for forming an alignment mark is located on the fourth conductive layer 210 of the input sensing unit 200, the dead space of the display module 10_1 may not be increased by the first dummy pattern 211.

Figure 12:
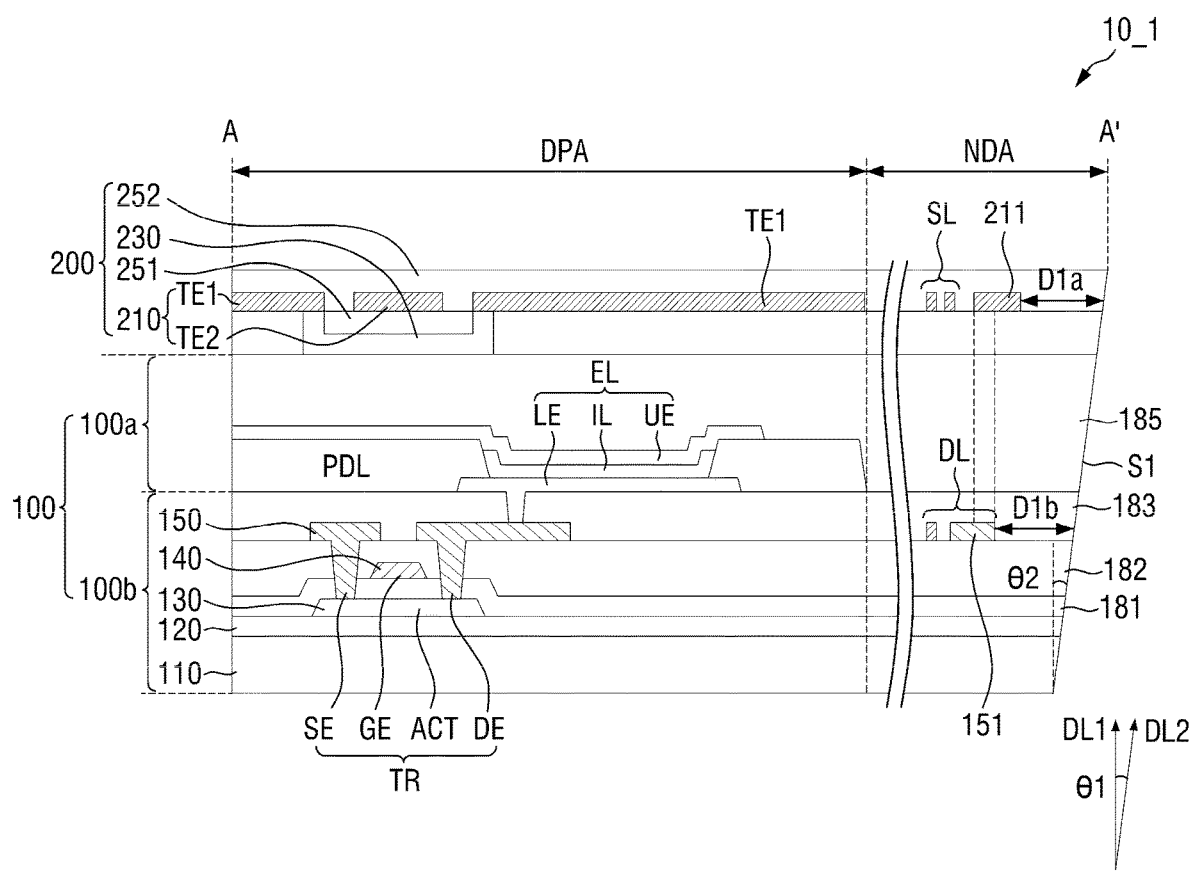
FIGS. 12 and 13 are cross-sectional views showing various exemplary embodiments of a display module.
Figure 13:
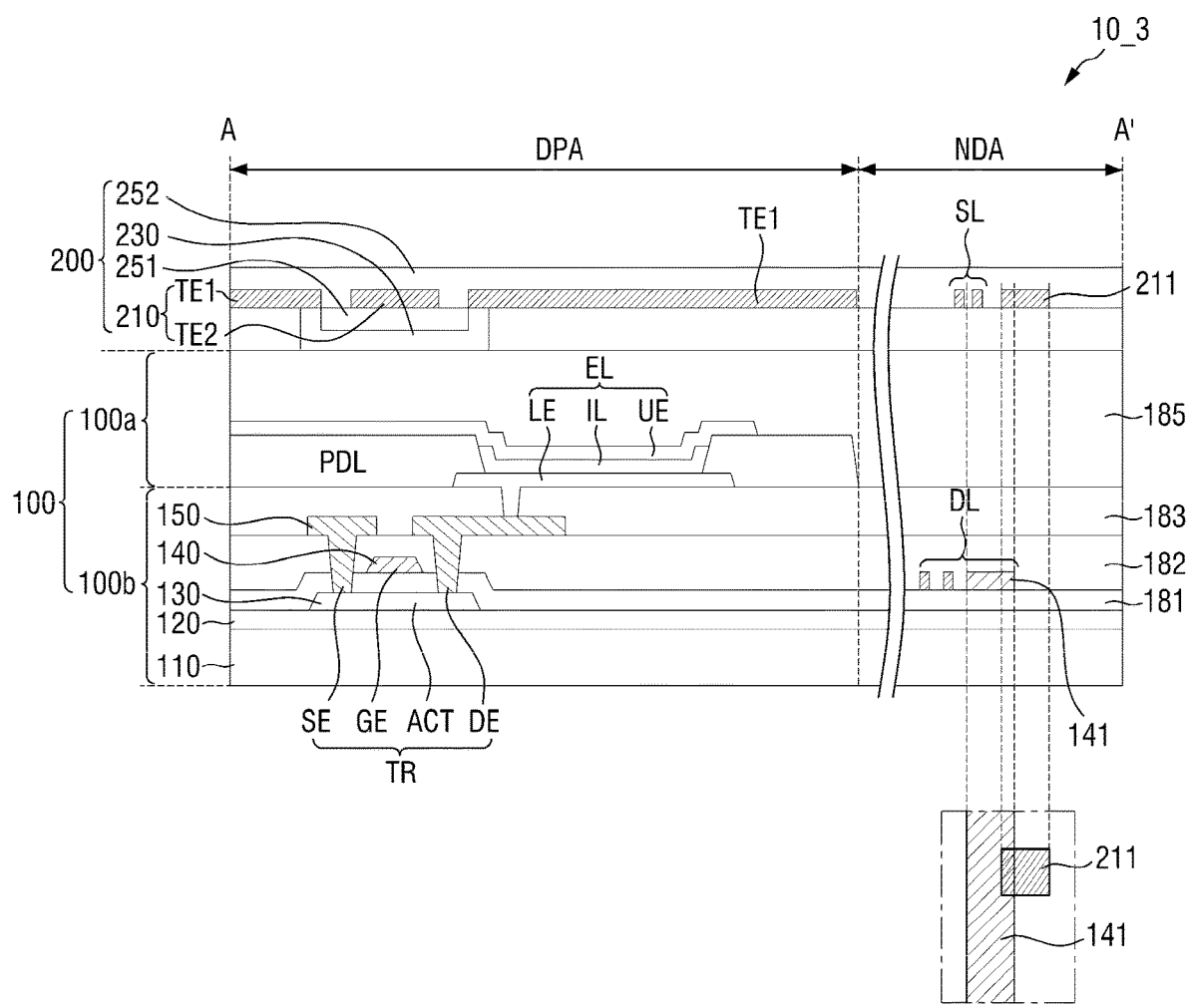

FIGS. 12 and 13 are cross-sectional views showing various exemplary embodiments of a display module. FIGS. 12 and 13 show the cross-sectional view corresponding to FIG. 3 and the alignment mark image corresponding to FIG. 9, respectively.

First, referring to FIGS. 3 and 12, a display module 10_2 is different from the display module 10 of FIG. 3 in that it includes a first signal line 151_1 and a first dummy pattern 211_1.

The first dummy pattern 211_1 may be disposed on the fourth conductive layer 210 of the display module 10_2, and may be substantially the same as the first dummy pattern 211 described with reference to FIG. 3 except for size. The width of the first dummy pattern 211_1 (that is, the length toward the side surface of the display module 10_2) may be smaller than the first width W1 of the first dummy pattern 211 described with reference to FIG. 3 (or the length of the protrusion of the alignment mark image IMAGE). When the sensing lines SL (or the outermost sensing line) are located relatively adjacent to the side surface of the display module 10_2, the width of the first dummy pattern 211_1 may be relatively small in order to form an alignment mark within a defined dead space.

In this case, the width of the first dummy pattern 211_1 may relatively decrease, but the first signal line 151_1 may include a protrusion partially overlapping the first dummy pattern 211_1.

The protrusion protrudes from the first dummy pattern 211_1 toward the first lateral side of the display module 10_2, but the length of this protrusion may be shorter than the length of the protrusion of the alignment mark.

The first signal line 151_1 and the first dummy pattern 211_1 constitute one alignment mark image, and this alignment mark image may coincide with the alignment mark AM described with reference to FIGS. 8 and 9.

That is, when the sensing lines SL (or the outermost sensing line) of the input sensing unit 200 are located relatively outward, a relatively small protrusion is formed on the first signal line 151_1, thereby preventing the increase of the dead space of the display module 10_2 and minimizing the possibility of damage of the first signal line 151_1 due to static electricity.

Referring to FIGS. 3 and 13, a display module 10_3 is different from the display module 10 of FIG. 3 in that it includes a first signal line 141 and a first dummy pattern 211.

The first signal line 141 may be substantially the same as the gate line described with reference to FIG. 4. That is, the gate line included in the display unit 100 (or the first conductive layer 140) may be disposed adjacent to the outer periphery of the display module 10_3 as compared with other lines (for example, MCD line).

The relationship between the first dummy pattern 211 and the first signal line 141 may be substantially the same as the relationship between the first dummy pattern 211 and the first signal line 151, described with reference to FIG. 3.

Figure 14:
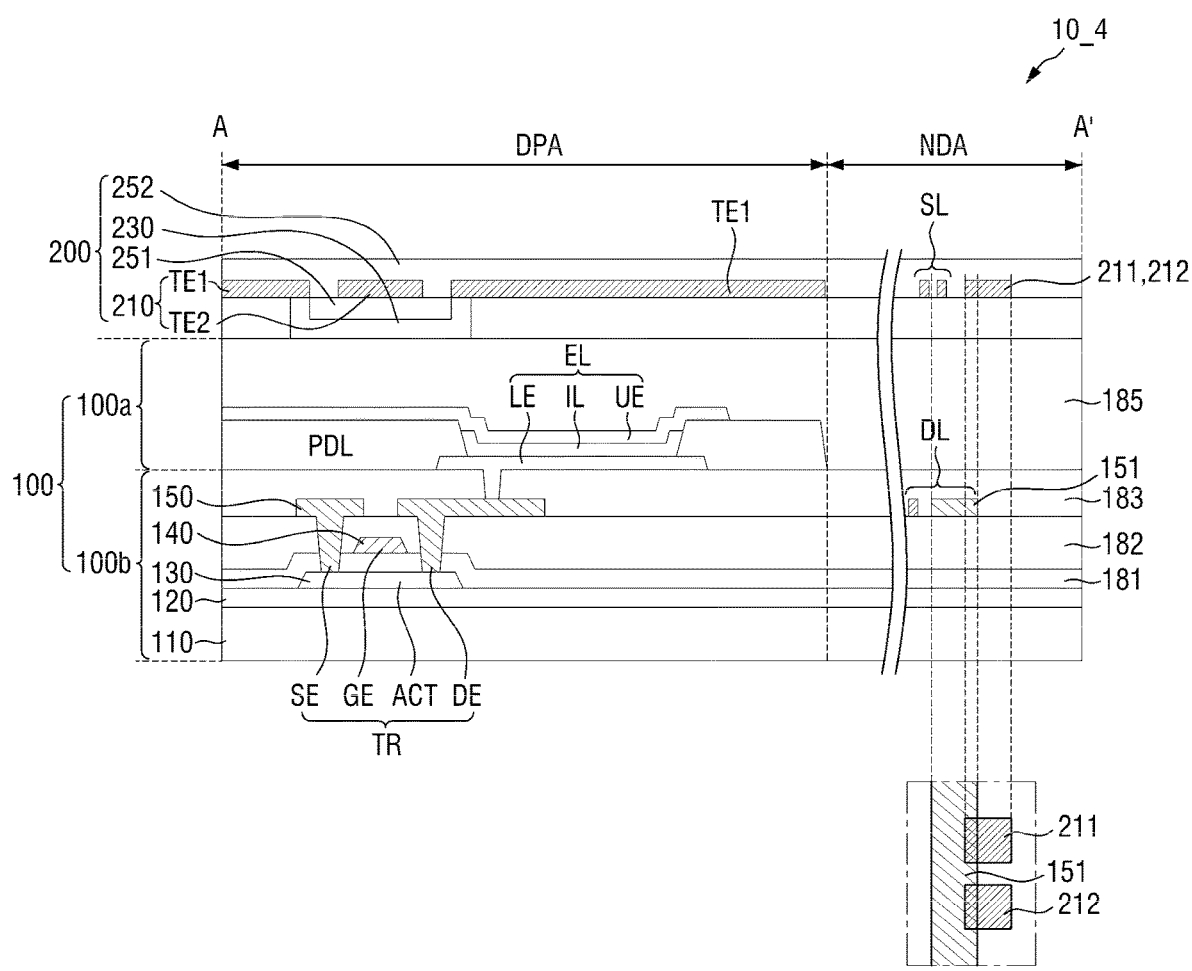
FIG. 14 is a cross-sectional view showing a display module according to an exemplary embodiment.
Figure 15:
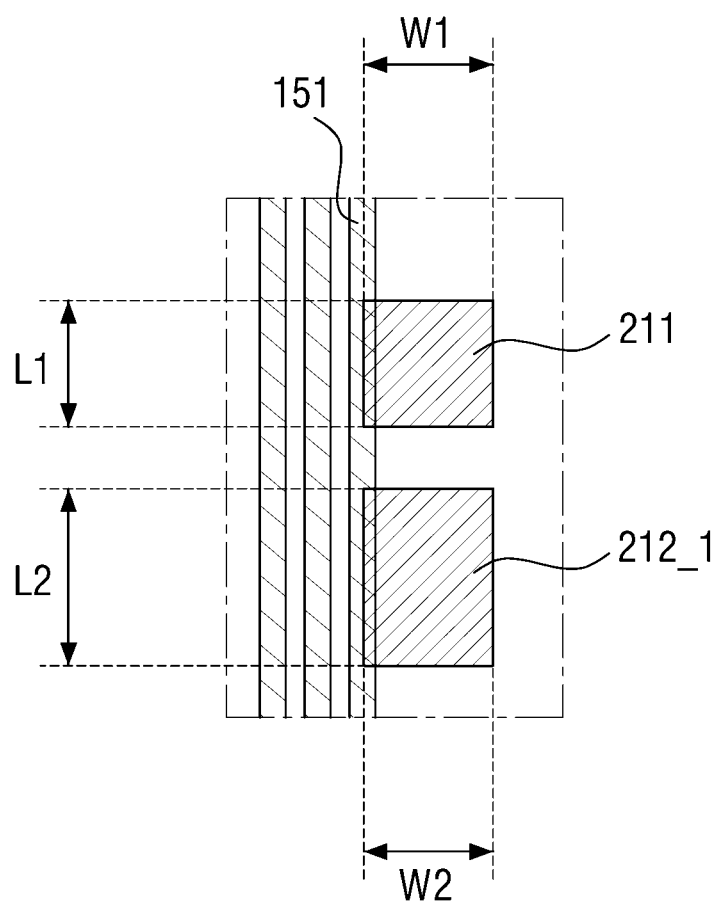
FIGS. 15 and 16 are views showing dummy patterns included in the display module of FIG. 14 according to exemplary embodiments.
Figure 16:
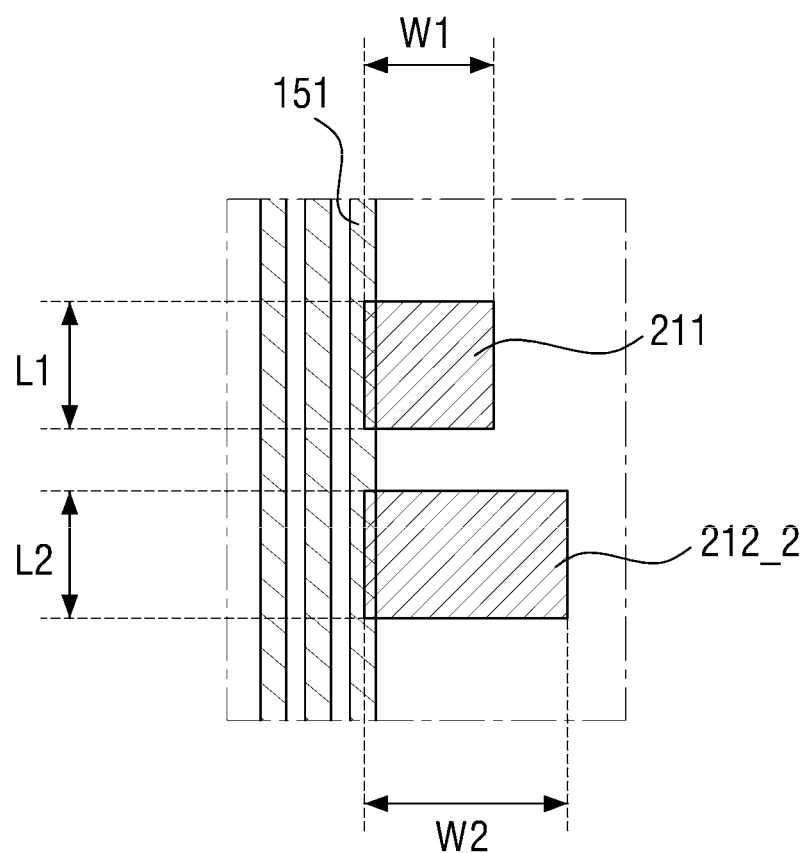

FIG. 14 is a cross-sectional view showing a display module according to an exemplary embodiment. FIGS. 15 and 16 are views showing dummy patterns included in the display module of FIG. 14 according to exemplary embodiments.

Referring to FIGS. 3, 6A, and 14 to 16, a display module 10_4 is different from the display module 10 of FIG. 3 in that it uses a second dummy pattern 212 as an alignment mark.

Since this second dummy pattern 212 is substantially the same as the second dummy pattern 212 (or the first dummy pattern 211) shown in FIG. 6, a redundant description will not be repeated.

The alignment mark or alignment mark image formed by the first signal line 151, the first dummy pattern 211, and the second dummy pattern 212 may include two protrusions protruding in the first direction (or horizontal direction). In this case, the alignment mark image may have more feature points than the alignment mark image having one protrusion, and may be more easily distinguished or identified from other images having a similar shape.

In exemplary embodiments, the second dummy pattern 212 may have a different size and/or shape from the first dummy pattern 211.

As shown in FIG. 15, the second length L2 of the second dummy pattern 212_1 may be longer than the first length L1 of the first dummy pattern 211. Further, as shown in FIG. 16, the second width W2 of the second dummy pattern 212_2 may be longer than the first width W1 of the first dummy pattern 211.

Although it is shown in FIGS. 15 and 16 that each of the second dummy patterns 212_1 and 212_2 has a shape similar to that of the first dummy pattern 211, has a second width W2 different from the first width W1 of the first dummy pattern 211, and has a second length L2 different from the first length L1 of the first dummy pattern 211, the present invention is not limited thereto. For example, the second dummy pattern 212 shown in FIG. 14 may have a semi-circular planar shape similar to that of the second dummy pattern 212_1 shown in FIG. 6B, and may have a second length L2 different from the first length L1 of the first dummy pattern 211.

As described with reference to FIGS. 14 and 16, the first signal line 151, the first dummy pattern 211, and each of the second dummy patterns 212, 212_1, and 212_2, that is, three components constitute one alignment mark, and the alignment mark may have more feature points, so that the alignment mark may be more easily detected.

Figure 17:
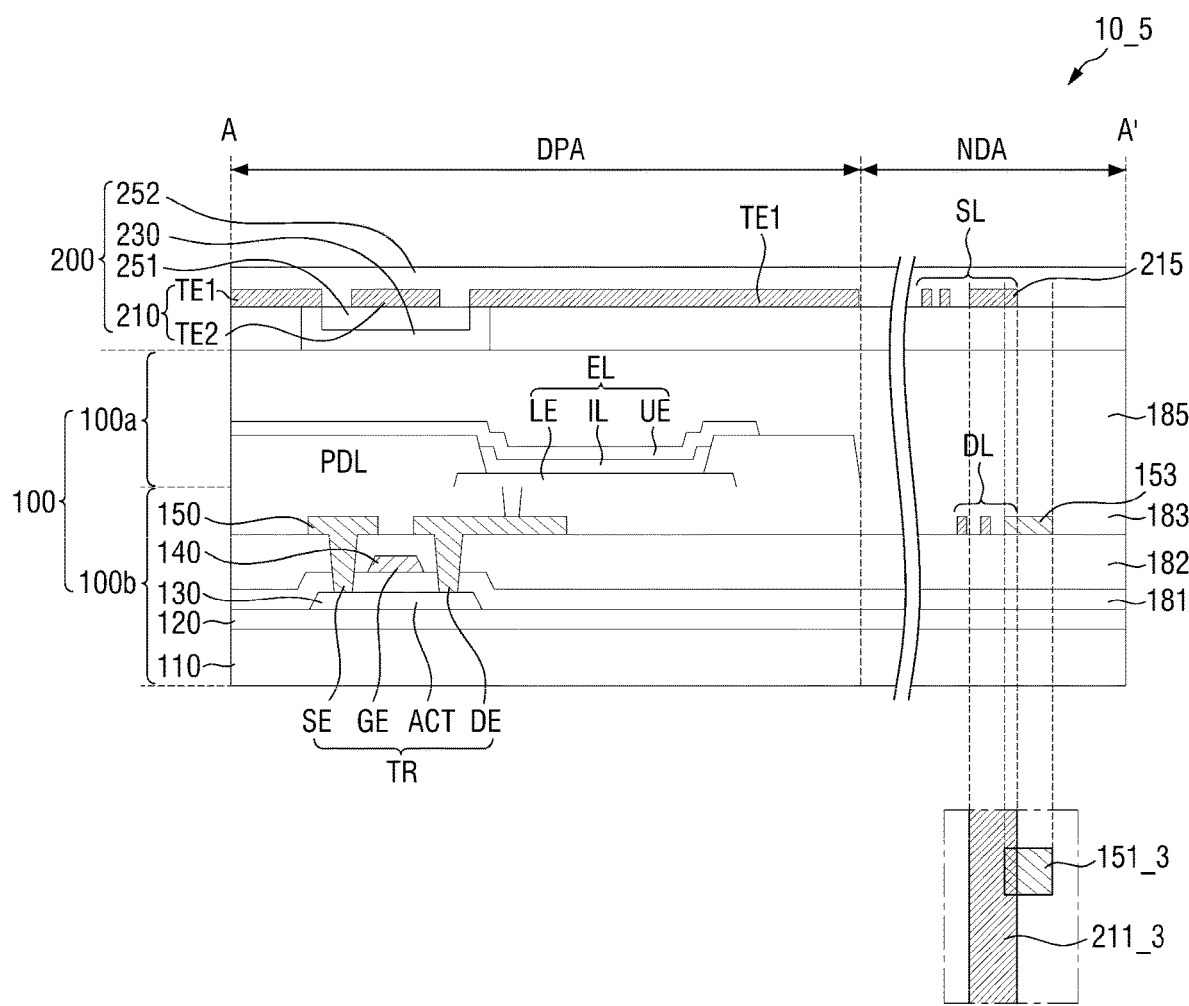
FIG. 17 is a cross-sectional view showing a display module taken along the line A-A' of FIG. 2 according to an exemplary embodiment.
Figure 18:
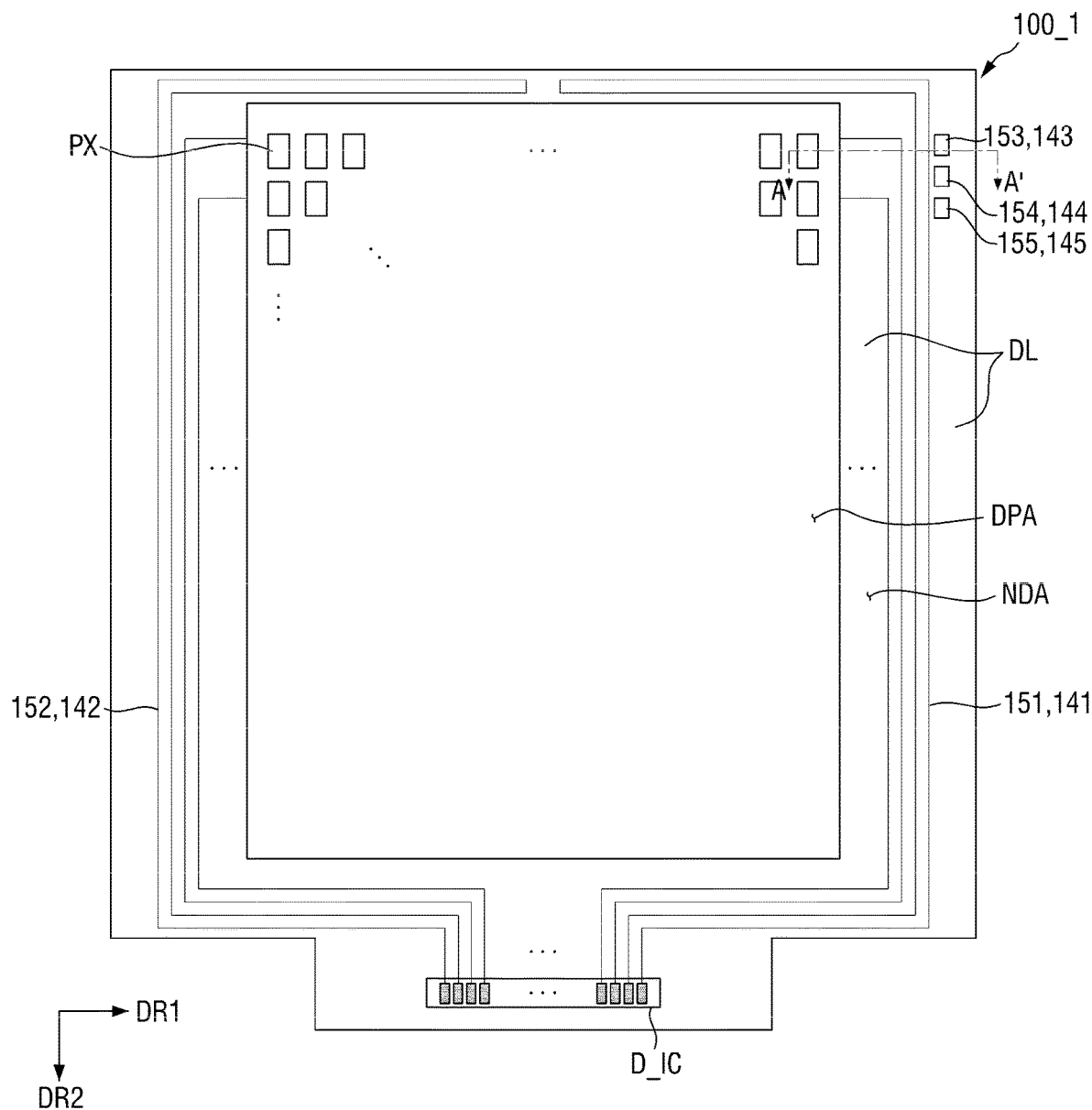
FIG. 18 is a plan view showing a display unit included in the display module of FIG. 17 according to an exemplary embodiment.
Figure 19:
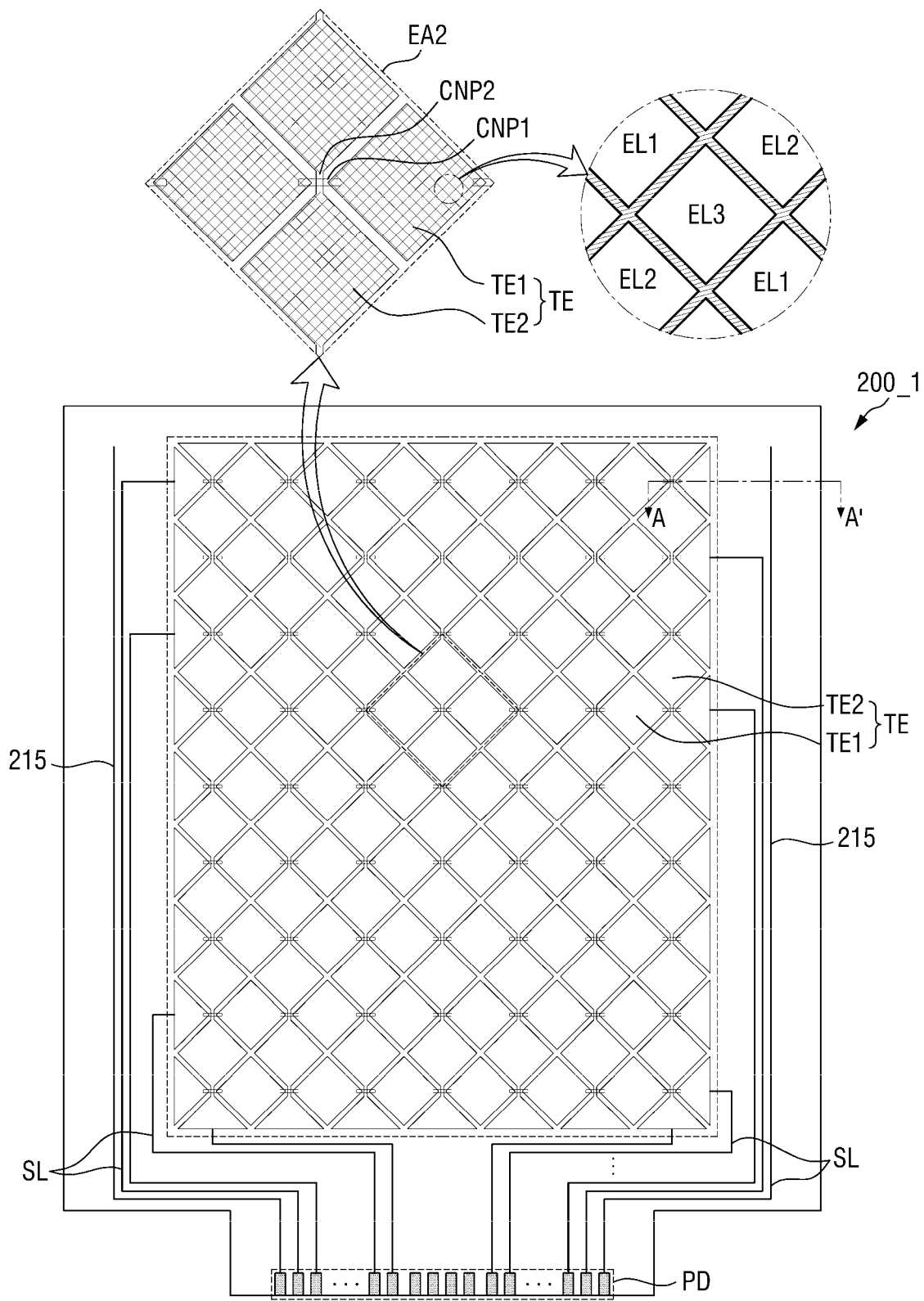
FIG. 19 is a plan view showing an input sensing unit included in the display module of FIG. 17 according to an exemplary embodiment.

FIG. 17 is a cross-sectional view showing a display module taken along the line A-A' of FIG. 2 according to an exemplary embodiment. FIG. 18 is a plan view showing a display unit included in the display module of FIG. 17 according to an exemplary embodiment. FIG. 19 is a plan view showing an input sensing unit included in the display module of FIG. 17 according to an exemplary embodiment.

Referring to FIGS. 2 to 5 and 17 to 19, a display module 10_5 is different from the display module 10 of FIG. 3 in that it includes a first sensing line 215 and a first dummy line pattern 153.

As shown in FIG. 18, a display unit 100_1 is different from the display unit 100 shown in FIG. 4 in that it includes at least one of first to third dummy line patterns 153, 154, and 155. Since the first to third dummy line patterns 153, 154, and 155 are substantially the same as the first to third dummy patterns 211, 212, and 213 described with reference to FIG. 5, respectively, that is, the layout positions, shapes, and sizes of the first to third dummy line patterns 153, 154, and 155 on a plane are substantially the same as those of the first to third dummy patterns 211, 212, and 213, respectively, a redundant description will not be repeated.

The first dummy line patterns 153 and 143, the second dummy line patterns 154 and 144, and the third dummy line patterns 155 and 145 may be disposed in the non-display area NDA of the display module 10_5, and may be disposed outside the first sensing line 215 (that is, the sensing line disposed at the outermost periphery of the input sensing unit 200_1) (that is, adjacent to one lateral side of the display module 10_5).

As shown in FIG. 17, the first dummy line pattern 153 may be included in or disposed on the second conductive layer 150.

Meanwhile, as shown in FIG. 19, an input sensing unit 200_1 is different from the input sensing unit 200 shown in FIG. 5 in that it does not include the first to third dummy patterns 211, 212, and 213. Since the input sensing unit 200_1 is substantially the same as the input sensing unit 200 shown in FIG. 5, a redundant description will not be repeated.

The first sensing line 215 may be located at the outermost one of the sensing lines SL. Further, the first sensing line 215 may be located farthest from the display area DPA among the sensing lines SL and signal lines DL in the display module 10_5, or may be located nearest to one lateral side of the display module 10_5. Since the first sensing line 215 is substantially the same as the first signal line 151 described with reference to FIG. 4, a redundant description will not be repeated.

The first sensing line 215 may be a guard line or a ground line extending along the outermost periphery of the input sensing unit 200_1, having a floating state or being grounded, and preventing the introduction of static electricity into the input sensing unit 200_1 from the outside.

Referring to FIG. 17 again, an overlap pattern or an alignment mark may be formed by overlapping the first sensing line 215 and the first dummy line pattern 153, and the shape of the alignment mark may be the same as the shape of the alignment mark AM described with reference to FIG. 8.

As described above, when the first sensing line 215 included in the input sensing unit 200_1 is the outermost line of the display module 10_5, the display unit 100_1 may include the dummy line patterns 153, 154, and 155, and may form an alignment mark by overlapping the dummy line patterns 153, 154, and 155 and the first sensing line 215.

Figure 20:
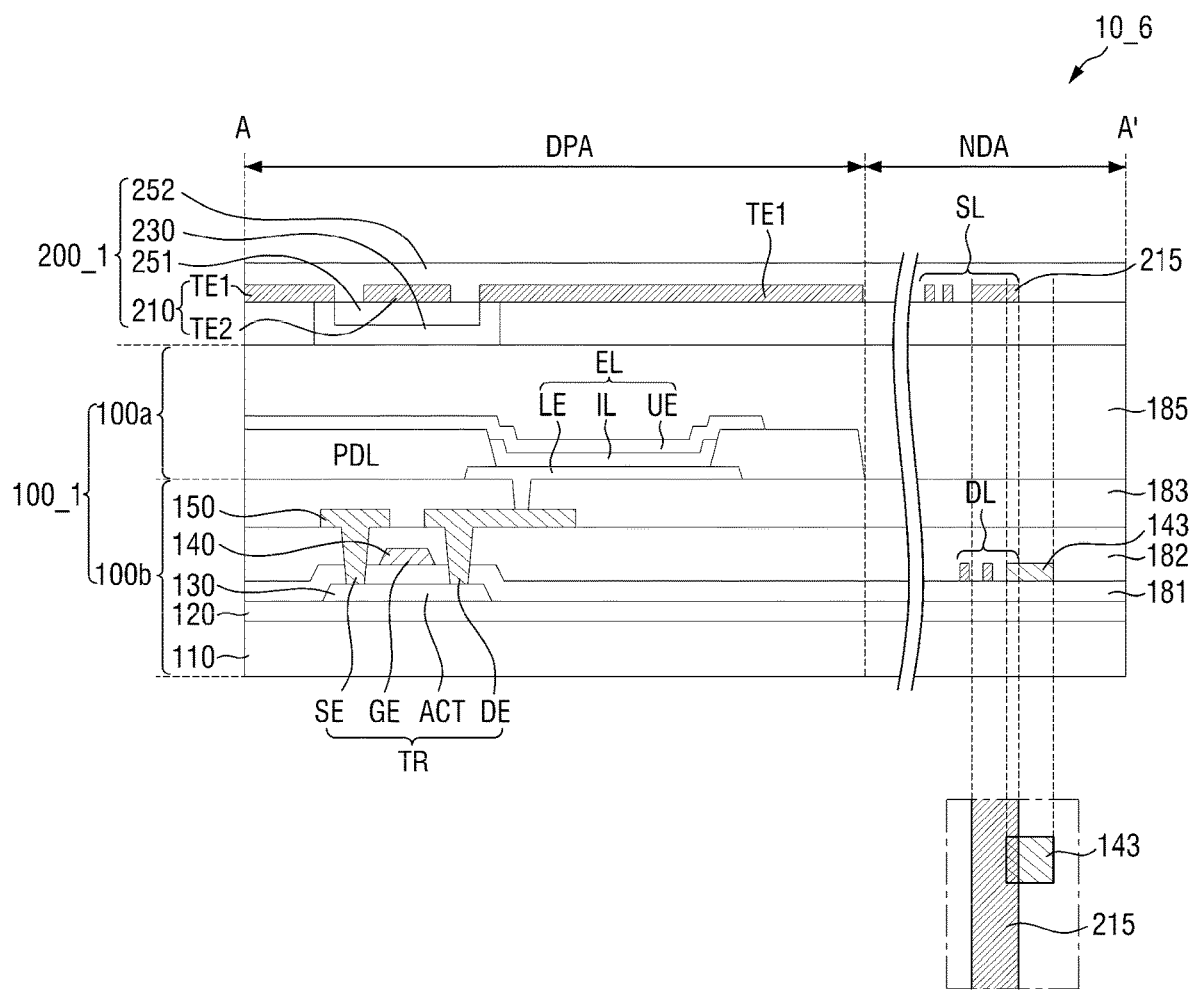
FIGS. 20 and 21 are cross-sectional views showing various exemplary embodiments of a display module.
Figure 21:
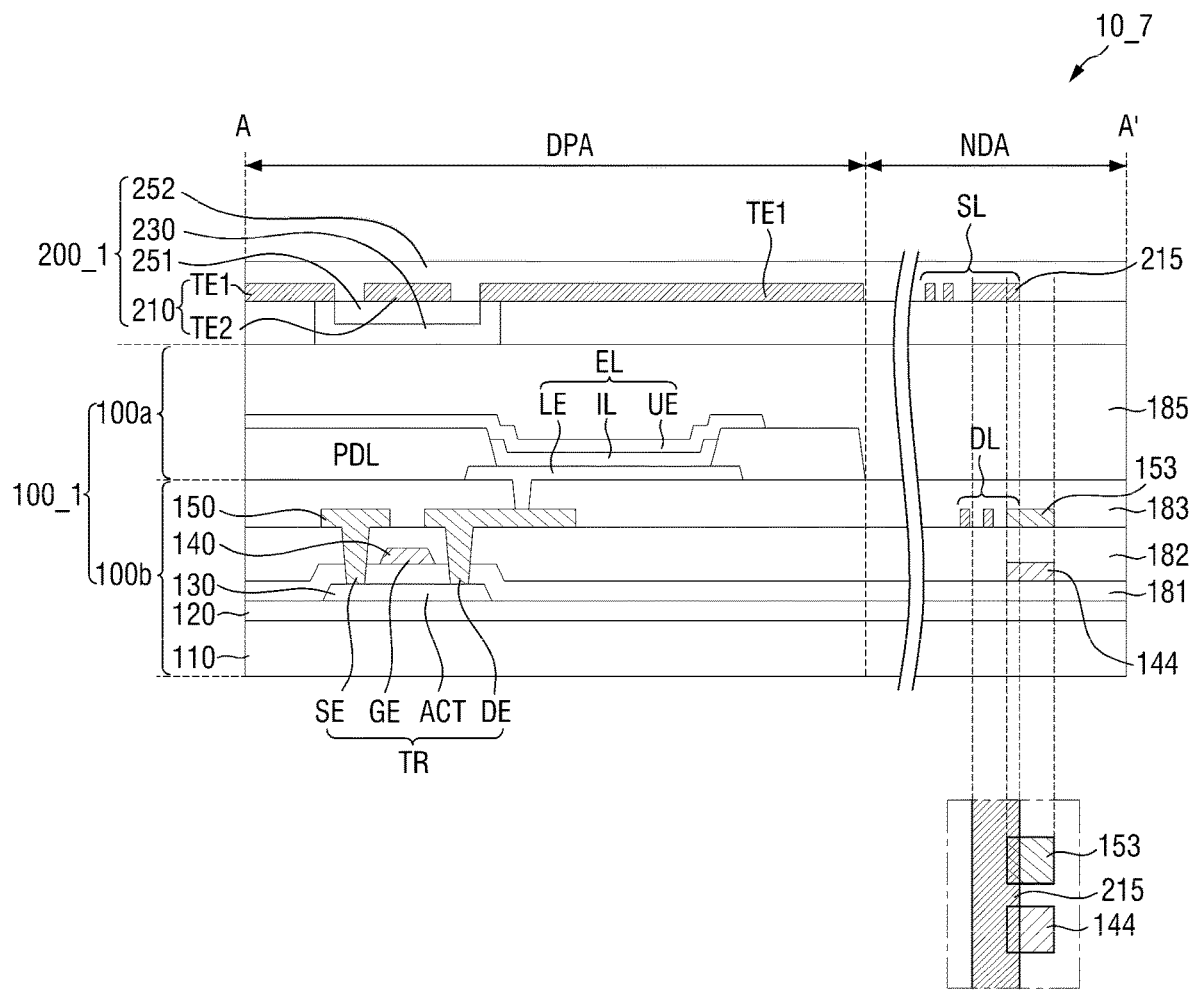

FIGS. 20 and 21 are cross-sectional views showing various exemplary embodiments of a display module.

Referring to FIGS. 17 and 20, a display module 10_6 is different from the display module 10_5 of FIG. 17 in that it includes a first dummy line pattern 143.

The first dummy line pattern 143 may be substantially the same as the first dummy line pattern 153 described with reference to FIG. 17, except for layout position in a plan view. The first dummy line pattern 143 may be included in or disposed on the first conductive layer 140.

The first dummy line pattern 143 may partially overlap the first sensing line 215 to form an alignment mark.

Referring to FIGS. 17, 18, and 21, a display module 10_7 is different from the display module 10_5 of FIG. 17 in that it further includes a second dummy line pattern 144.

The second dummy line pattern 144 may be disposed on the first conductive layer 140. The planar layout relationship between the first dummy line pattern 153 and the second dummy line pattern 144 may be substantially the same as or similar to the planar layout relationship between the first dummy pattern 211 and the second dummy pattern 212 described with reference to FIG. 6A.

Meanwhile, although it is shown in the drawings that the first dummy line pattern 153 is located above the second dummy line pattern 144 in a plan view, the present invention is not limited thereto. For example, the second dummy line pattern 144 may be located above the first dummy line pattern 153.

FIGS. 22 to 25 are cross-sectional views showing various exemplary embodiments of a display module.

Each of display modules 10_8, 10_9, 10_10, and 10_11 shown in FIGS. 22 to 25 may include the input sensing unit 200 of FIG. 5 and the display unit 100_1 of FIG. 18.

That is, each of the display modules 10_8, 10_9, 10_10, and 10_11 shown in FIGS. 22 to 25 may form an alignment mark using at least one of the dummy patterns 211, 212, and 213 included in the input sensing unit 200 and at least one of the dummy line patterns 153, 154, 155, 143, 144, and 145 included in the display unit 100_1.

Figure 22:
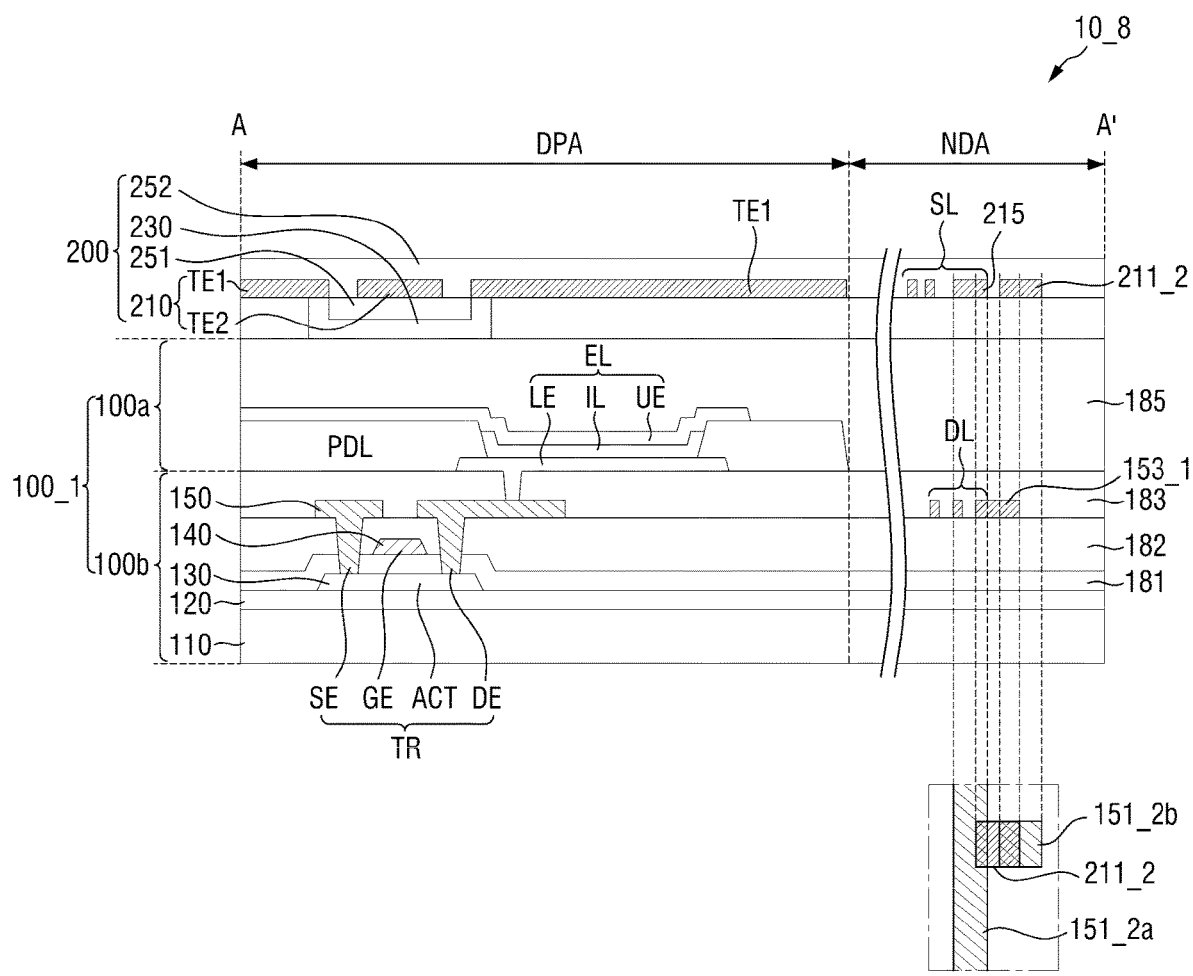
FIGS. 22 to 25 are cross-sectional views showing various exemplary embodiments of a display module.

Referring to FIGS. 17 and 22, the display module 10_8 is different from the display module 10_5 of FIG. 17 in that it includes a first dummy pattern 211_2 and a first dummy line pattern 153_1.

The first dummy pattern 211_2 may be disposed to be spaced apart from the first sensing line 215 toward the outside of the display module 10_8. The first dummy pattern 211_2 may have a rectangular planar shape, but the width of the first dummy pattern 211_2 may be smaller than the width of the second portion P2 of the alignment mark AM described with reference to FIG. 8, or may be smaller than the width W1 of the first dummy pattern 211 described with reference to FIG. 6A.

The first dummy line pattern 153_1 may be disposed between the first sensing line 215 and the first dummy pattern 211_2 on a plan view, and may partially overlap each of the first sensing line 215 and the first dummy pattern 211_2.

The first sensing line 215, the first dummy line pattern 153_1, and the first dummy pattern 211_2 may overlap each other to constitute one alignment mark.

When the first sensing line 215 is located at the outermost position in the display module 10_8, or when the side surface of the display module 10_3 is processed using the laser described with reference to FIG. 11, it may be difficult to secure the shape/area corresponding to the second portion P2 of the alignment marks AM in the second conductive layer 150 with only the first dummy line pattern 153_1, and in this case, the alignment mark may be formed by overlapping the first dummy line pattern 153_1 and the first dummy pattern 211_2.

Figure 23:
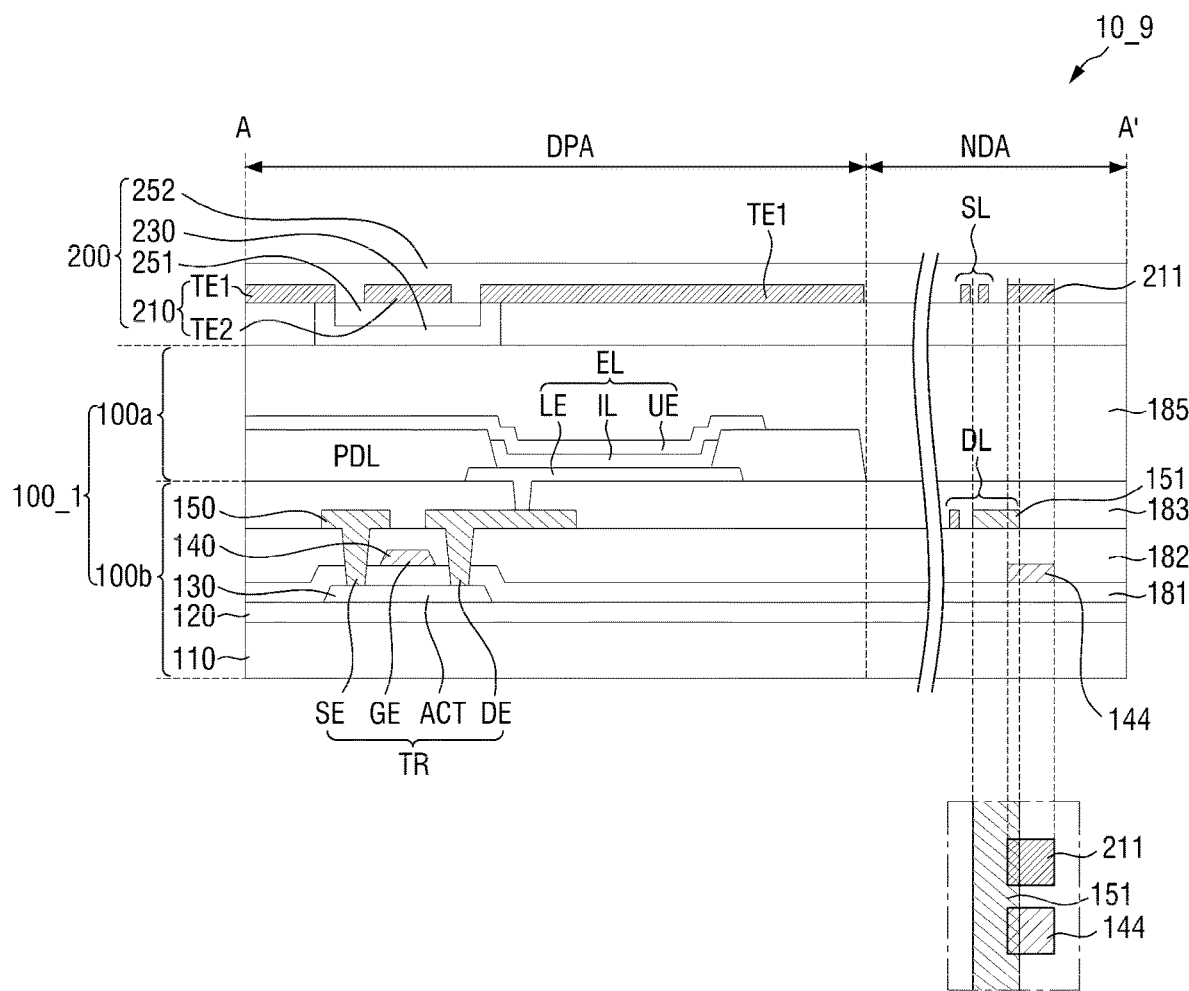

Referring to FIG. 23, the display module 10_9 is different from the display module 10 of FIG. 3 in that it includes a second dummy line pattern 144.

The second dummy line pattern 144 may be substantially the same as the second dummy line pattern 144 described with reference to FIG. 21. That is, the second dummy line pattern 144 may overlap the first signal line 151 in a plan view, and may be disposed below the first dummy pattern 211.

The first signal line 151, the first dummy pattern 211, and the second dummy line pattern 144 may overlap each other to constitute one alignment mark.

Figure 24:
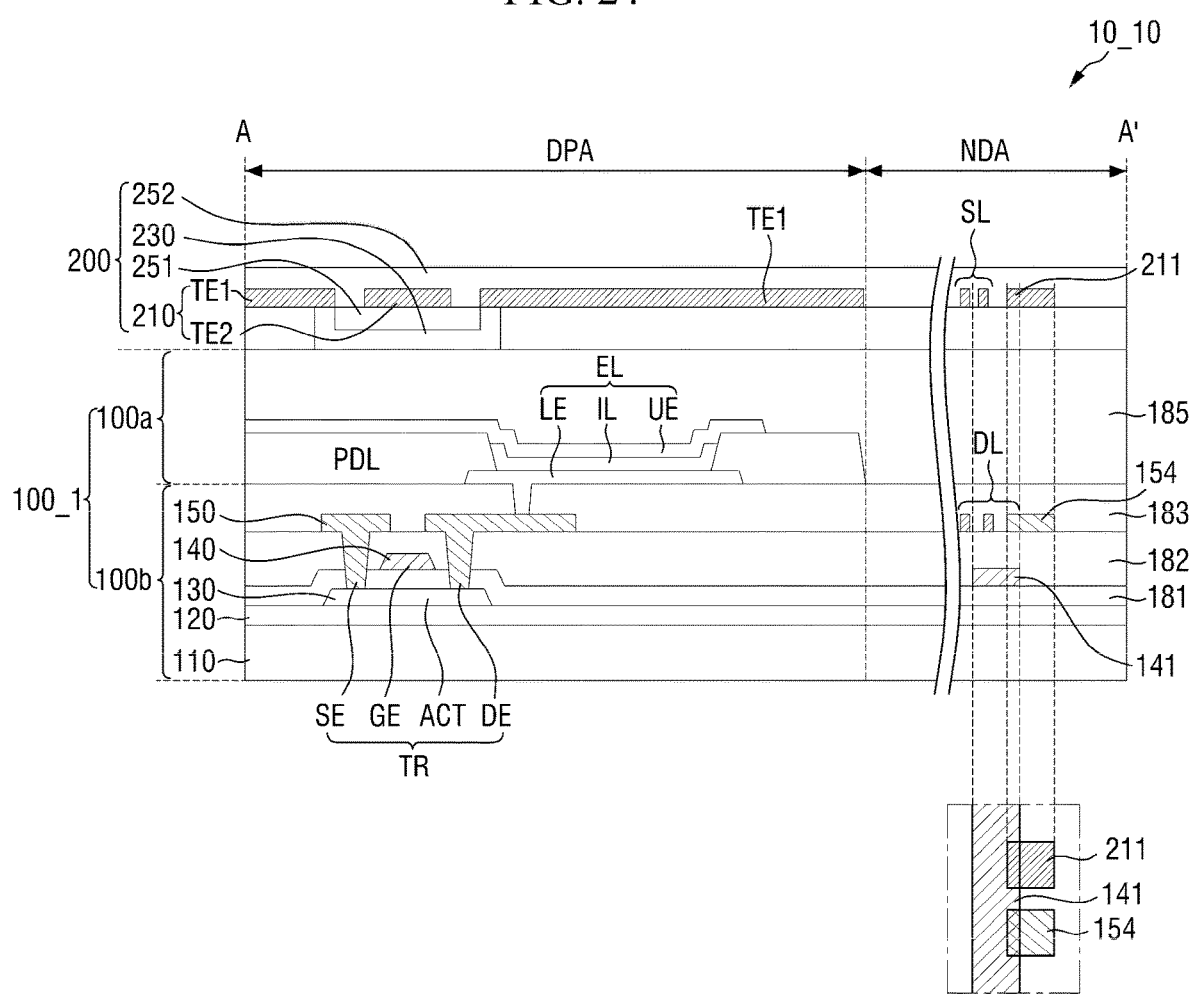

Referring to FIG. 24, the display module 10_10 is different from the display module 10_9 of FIG. 23 in that it includes a first signal line 151 and a second dummy line pattern 154.

The first signal line 141 may be substantially the same as the gate line described with reference to FIG. 4. That is, the first signal line 141 may be included in the first conductive layer 140, and may be disposed adjacent to the outer periphery of the display module 10_10 as compared with the other lines.

The second dummy line pattern 154 may be disposed on the second conductive layer 150, may partially overlap the first signal line 141 in a plan view, and may be disposed below the first dummy pattern 211.

The first signal line 141, the first dummy pattern 211, and the second dummy line pattern 154 may overlap each other to constitute one alignment mark.

Figure 25:
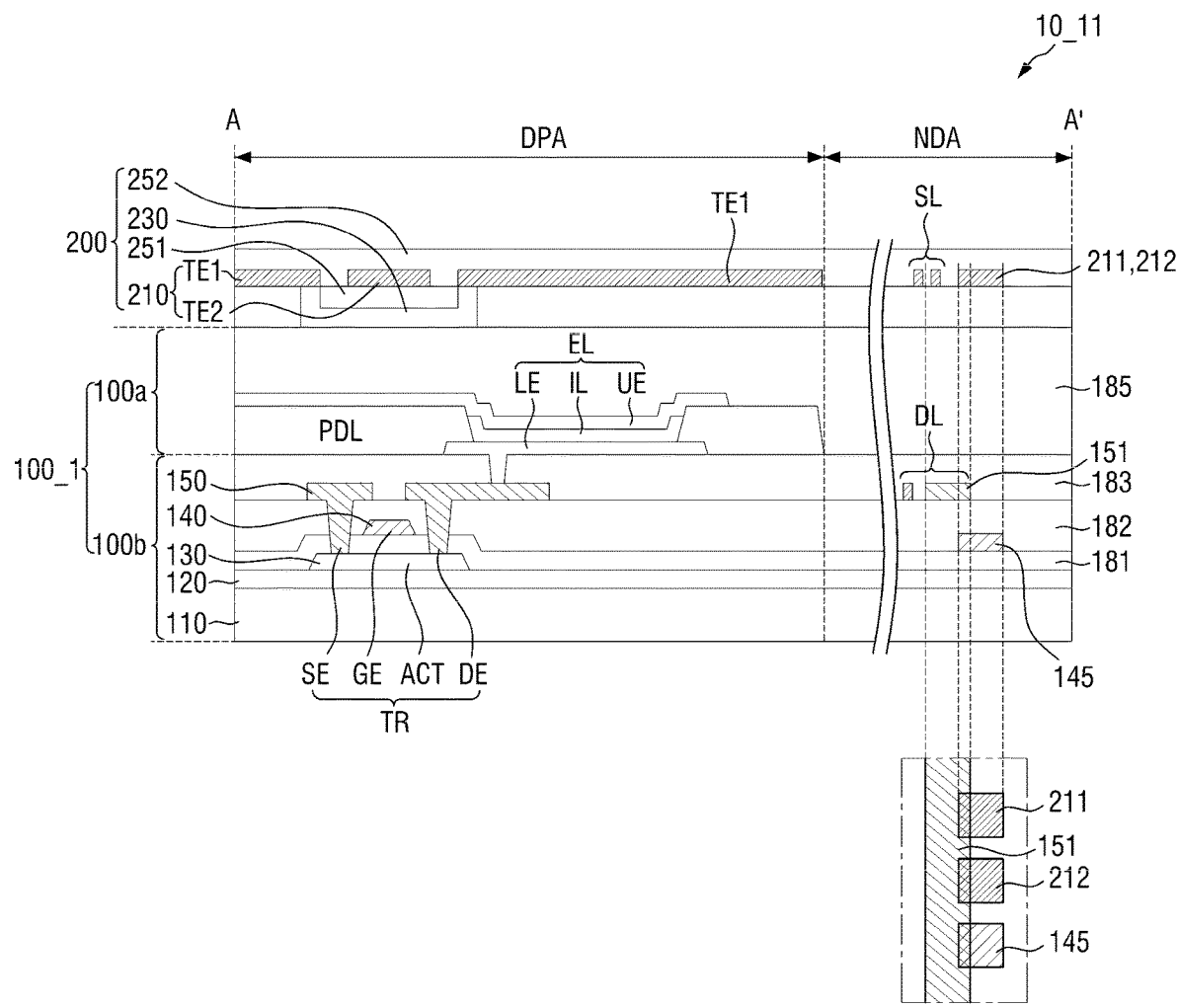

Referring to FIG. 25, the display module 10_11 is different from the display module 10_9 of FIG. 23 in that it includes a second dummy pattern 212, and further includes a third dummy line pattern 145.

The second dummy pattern 212 maybe disposed on the fourth conductive layer 210 where the first dummy pattern 211 is located, may partially overlap the first signal line 151 in a plan view, and may be disposed below the first dummy pattern 211.

The third dummy line pattern 145 maybe disposed on the first conductive layer 140, may partially overlap the first signal line 151 in a plan view, and may be disposed below the second dummy pattern 212.

The first signal line 151, the first dummy pattern 211, the second dummy pattern 212, and the third dummy line pattern 145, that is, four components constitute one alignment mark, and the alignment mark may have more feature points, so that the alignment mark may be more easily detected.

Figure 26:
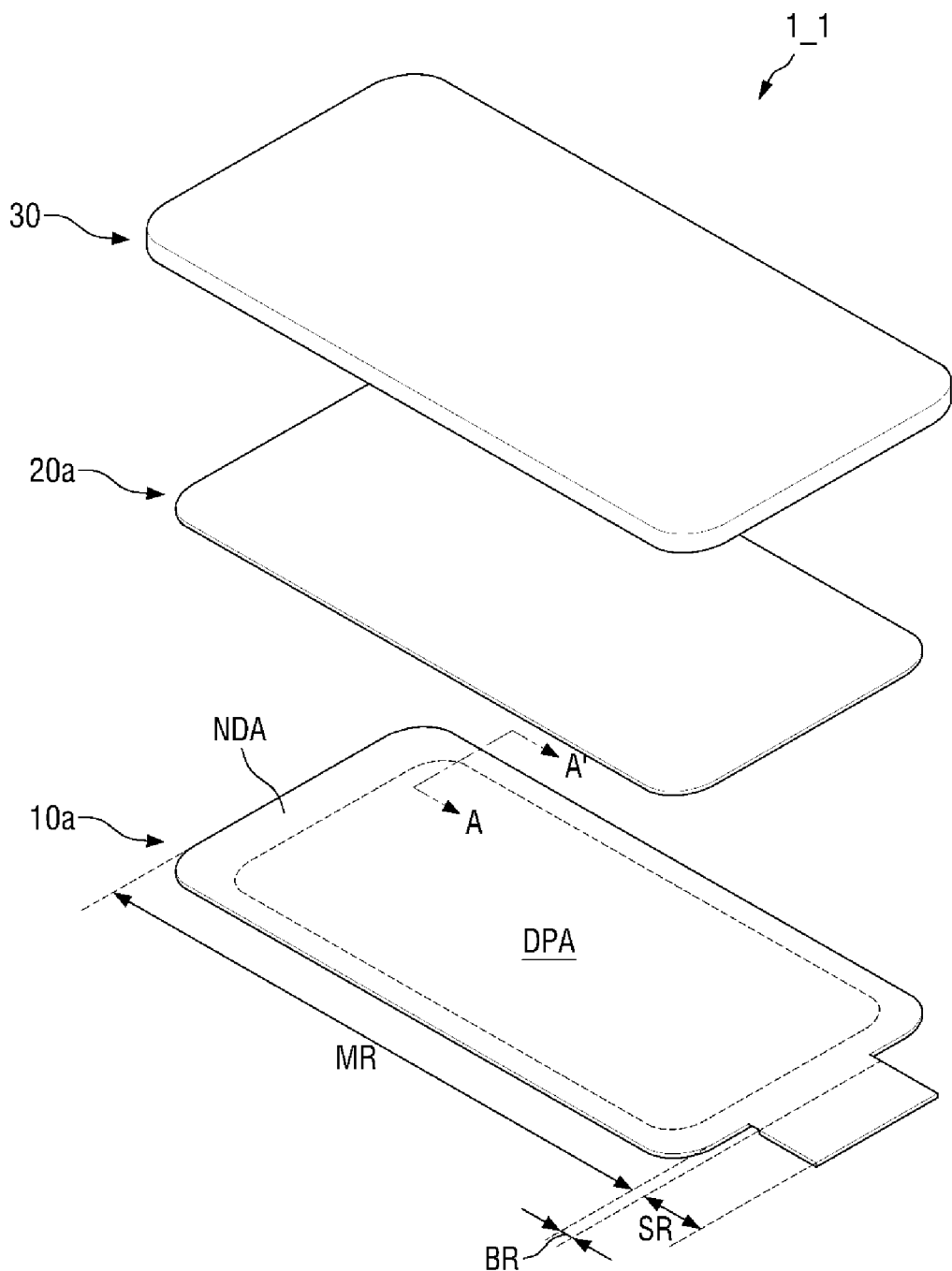
FIG. 26 is an exploded perspective view of a display device according to another exemplary embodiment.
Figure 27:
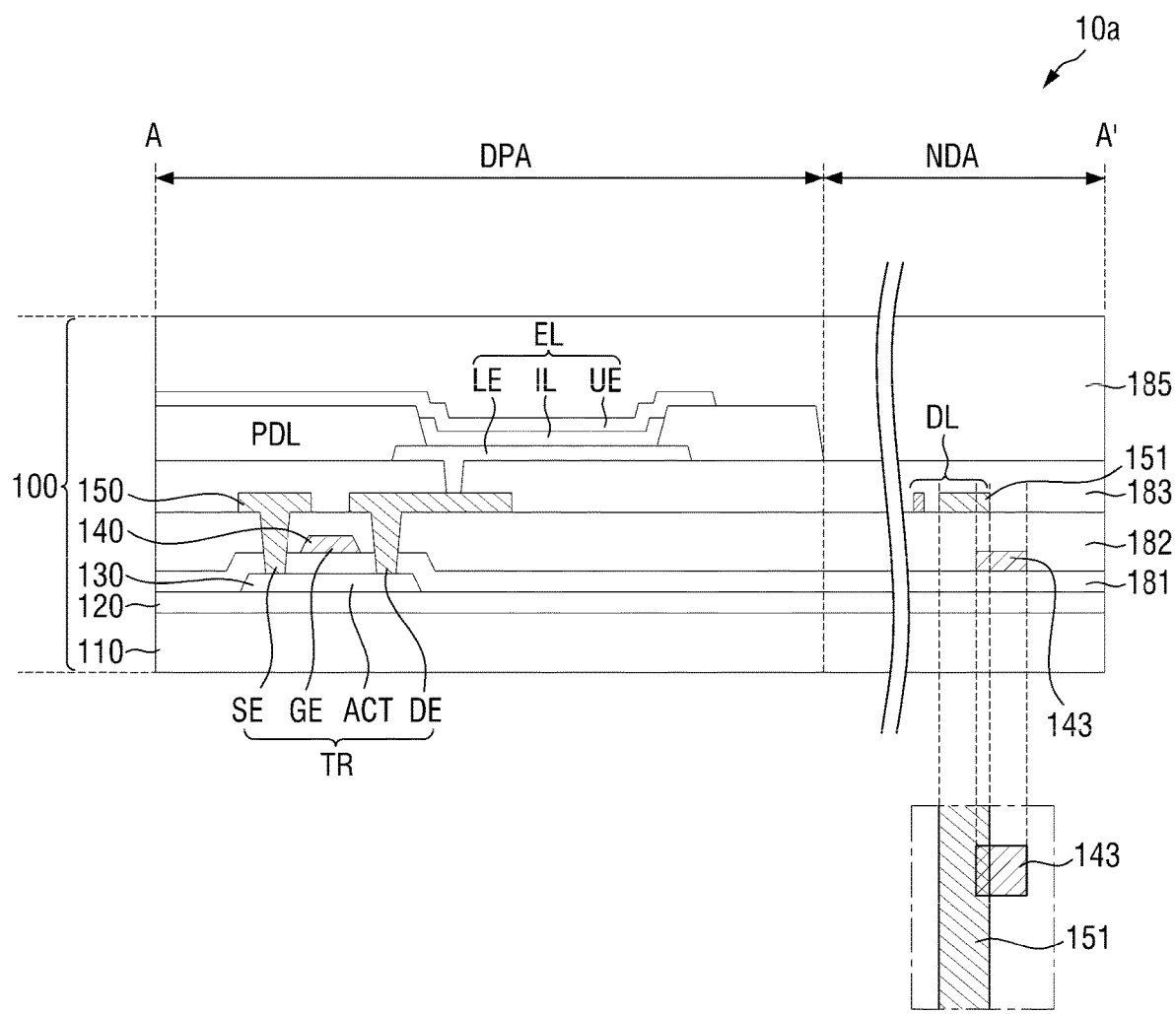
FIG. 27 is a cross-sectional view showing a display unit included in the display module of FIG. 26 according to an exemplary embodiment.

FIG. 26 is an exploded perspective view of a display device according to another exemplary embodiment. FIG. 27 is a cross-sectional view showing a display unit included in the display module of FIG. 26 according to an exemplary embodiment.

Referring to FIGS. 2, 3, 26, and 27, a display device 1_1 is different from the display device 1 of FIG. 2 in that it includes a display module 10a.

The display module 10a is different from the display module 10 of FIG. 3 in that it does not include the input sensing unit 200. Further, the display module 10a may include a first dummy line pattern 143.

The first dummy line pattern 143 may be included in the first conductive layer 140, and may be formed together with the gate electrode GE on the same layer through the same process.

The first dummy line pattern 143 may be disposed in the non-display area NDA of the display module 10a, and may be disposed outward from the first signal line 151. The first dummy line pattern 143 may be substantially the same as or similar to the first dummy pattern 211 described with reference to FIG. 3, except that the first dummy line pattern 143 is disposed on the first conductive layer 140.

When the first signal line 151 and first dummy line pattern 143 of the display module 10a overlap each other to form an alignment mark, the dead space of the display module 10a may be reduced, compared to when the alignment mark is formed independently to be spaced apart from the outermost line in the non-display area NDA of the display module 10a.

Further, the first dummy line pattern 143 may be disposed on a different layer from the first signal line 151 and may be electrically insulated from the first signal line 151, thereby preventing the damage of the display module 10a caused by static electricity.

Figure 28:
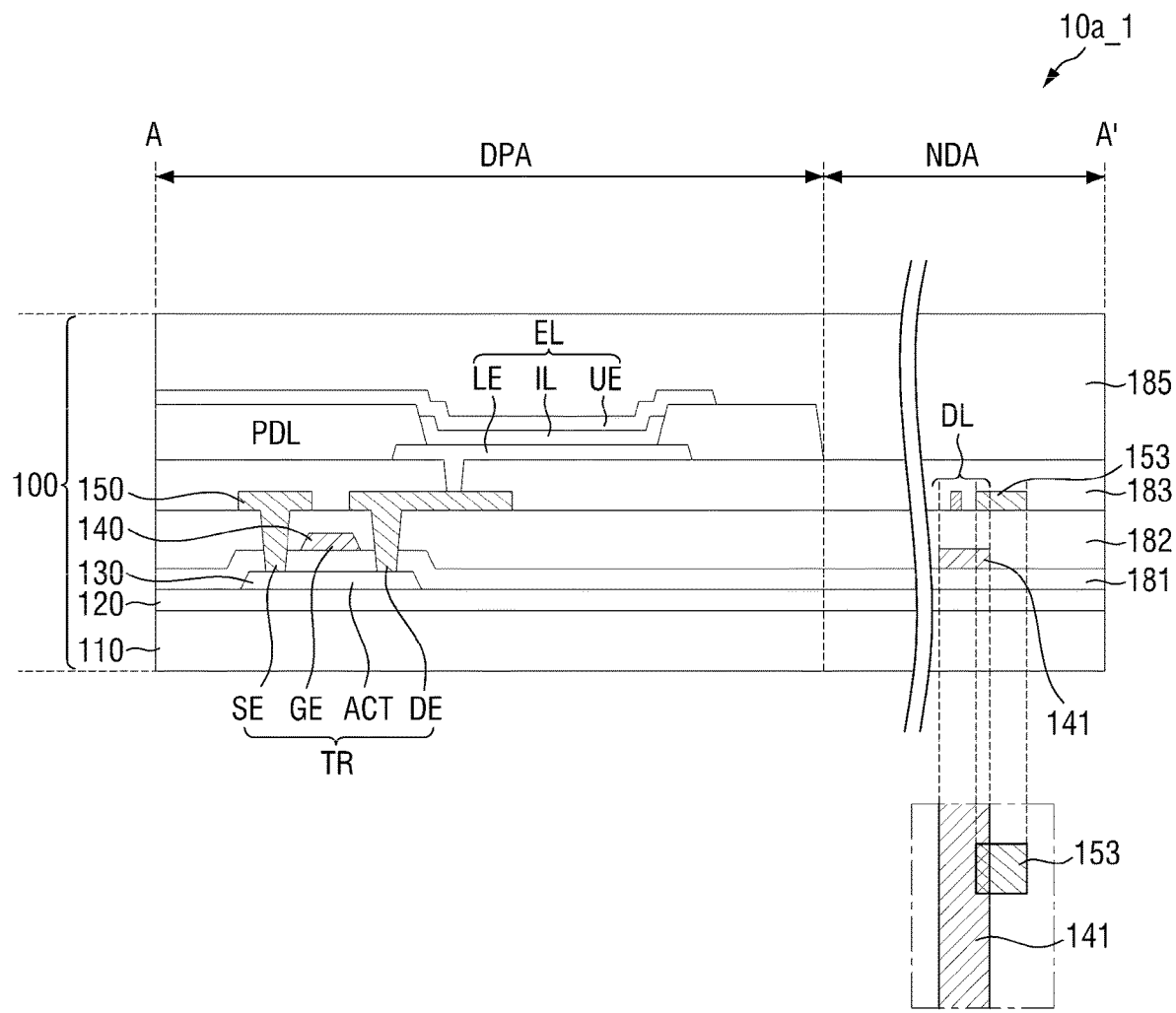
FIG. 28 is a cross-sectional view showing a display unit included in the display module of FIG. 26 according to an exemplary embodiment.

FIG. 28 is a cross-sectional view showing a display unit included in the display module of FIG. 26 according to an exemplary embodiment.

Referring to FIGS. 26 to 28, a display module 10a_1 is different from the display module 10a in that it includes a first signal line 141 and a first dummy line pattern 153.

The first signal line 141 may be substantially the same as the gate line described with reference to FIG. 4. That is, the gate line included in the display unit 100 (and the first conductive layer 140) may be disposed adjacent to the outer periphery of the display module 10a_1, as compared with the other lines.

The first dummy line pattern 153 may be disposed in the non-display area NDA of the display module 10a_1, and may be disposed outward from the first signal line 141 (that is, adjacent to one lateral side of the display module 10a_1). The first dummy line pattern 153 may be substantially the same as or similar to the first dummy pattern 211 described with reference to FIG. 3, except that the first dummy line pattern 153 is disposed on the second conductive layer 150.

As described above, according to the exemplary embodiments of the present invention, it is possible to provide a display device having a reduced dead space.

The effects of the present invention are not limited by the foregoing, and other various effects are anticipated herein.

Although the preferred exemplary embodiments of the present invention have been disclosed for illustrative purposes, those skilled in the art will appreciate that various modifications, additions and substitutions are possible, without departing from the scope and spirit of the invention as disclosed in the accompanying claims.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a display unit comprising transistors disposed in a display area and signal lines arranged in a non-display area located along an edge of the display area, at least one of the signal lines being electrically connected to the transistors; and
   an input sensing unit disposed over the display unit and comprising sensing electrodes disposed on the display area, sensing lines arranged on the non-display area, and a first dummy pattern disposed on the non-display area and spaced apart from the sensing electrodes, at least one of the sensing lines being electrically connected to the sensing electrodes,
   wherein the first dummy pattern overlaps a first signal line of the signal lines, the first signal line being spaced farthest from the display area, and
   wherein the display device further comprises an alignment mark, the alignment mark comprising:
   a first portion having an area of the first signal line including an overlap between the first signal line and the first dummy pattern in a plan view; and
   a second portion having an area of the first dummy pattern that protrudes from the first portion and does not overlap the first signal line in the plan view.

2. The display device of claim 1,
   wherein the first dummy pattern is isolated from the signal lines and the sensing lines.

3. The display device of claim 1,
   wherein the first signal line extends along the edge of the display unit, forms a closed loop, and is isolated from the transistors.

4. The display device of claim 1,
   wherein each of the transistors unit comprises:
   a semiconductor layer comprising a channel;
   a first conductive layer disposed on the semiconductor layer and comprising a gate electrode; and a second conductive layer disposed on the first conductive layer and comprising a source electrode and a drain electrode, and wherein the first conductive layer comprises the first signal line.

5. The display device of claim 1, wherein each of the transistors unit comprises:
- a semiconductor layer comprising a channel;
- a first conductive layer disposed on the semiconductor layer and comprising a gate electrode; and
- a second conductive layer disposed on the first conductive layer and comprising a source electrode and a drain electrode, and wherein the second conductive layer comprises the first signal line.

6. The display device of claim 1, wherein the first dummy pattern and the first signal line are configured to absorb light.

7. The display device of claim 1, wherein the first dummy pattern comprises a plurality of sub-line patterns arranged in parallel with each other.

8. The display device of claim 1, wherein a first side surface of the display unit adjacent to the first signal line forms an acute angle with an upper surface of the display unit, wherein a first side surface of the input sensing unit aligned with the first side surface of the display unit, forms an obtuse angle with the upper surface of the display unit, and wherein a distance from the first dummy pattern to the first side surface of the input sensing unit is greater than a distance from the first signal line to the first side surface of the display unit.

9. The display device of claim 1, wherein a first portion of the first dummy pattern has a smaller area than a second portion of the first dummy pattern.

10. The display device of claim 1, wherein the input sensing unit further comprises a second dummy pattern disposed on the non-display area and spaced apart from the sensing electrodes, the first portion of the alignment mark including an overlap between the first signal line and the first dummy pattern in the plan view, and wherein the alignment mark comprises a third portion having an area of the second dummy pattern that does not overlap the first signal line in the plan view.

11. The display device of claim 10, wherein the second dummy pattern has a total area different from a total area of the first dummy pattern.

12. The display device of claim 10, wherein the second dummy pattern has a shape different from a shape of the first dummy pattern.

13. The display device of claim 10, wherein the input sensing unit further comprises a third dummy pattern disposed on the non-display area and spaced apart from the sensing electrodes, and wherein the first portion of the alignment mark including an overlap between the first signal line and the third dummy pattern in the plan view and the alignment mark comprises a fourth portion having an area of the third dummy pattern that does not overlap the first signal line in the plan view.

14. The display device of claim 13, wherein the second dummy pattern has a shape different from a shape of the first dummy pattern, and wherein the third dummy pattern has a shape different from the shape of the second dummy pattern.

* * * * *